US007262992B2

(12) United States Patent
Shibata et al.

(10) Patent No.: US 7,262,992 B2
(45) Date of Patent: Aug. 28, 2007

(54) HEARING AID

(75) Inventors: Akihide Shibata, Nara (JP); Takayuki Ogura, Nara (JP); Hiroshi Iwata, Nara (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 552 days.

(21) Appl. No.: 10/844,525

(22) Filed: May 13, 2004

(65) Prior Publication Data

US 2004/0228499 A1 Nov. 18, 2004

(30) Foreign Application Priority Data

May 16, 2003 (JP) ............................ 2003-139070

(51) Int. Cl.
*G11C 11/34* (2006.01)
*G11C 7/00* (2006.01)

(52) U.S. Cl. .................. 365/185.05; 257/316; 257/322

(58) Field of Classification Search ........... 365/185.05; 257/316, 322

See application file for complete search history.

(56) References Cited

U.S. PATENT DOCUMENTS 5,424,979 A * 6/1995 Morii .................... 365/185.28
5,793,080 A * 8/1998 Hwang ....................... 257/316
6,493,270 B2 * 12/2002 Chevallier ............. 365/185.33

FOREIGN PATENT DOCUMENTS

| | | | |
|---|---|---|---|
| JP | 1-288199 | A | 11/1989 |
| JP | 6-40680 | B2 | 5/1994 |
| JP | 08-223698 | | 8/1996 |
| JP | 2638563 | B2 | 4/1997 |
| JP | 10-126890 | A | 5/1998 |
| JP | 2001-148899 | A | 5/2001 |
| JP | 2002-237540 | | 8/2002 |

* cited by examiner

*Primary Examiner*—Son Dinh
(74) *Attorney, Agent, or Firm*—Birch, Stewart, Kolasch & Birch, LLP

(57) ABSTRACT

A hearing aid comprising a data memory includes a plurality of semiconductor memory cells. The semiconductor memory cell has a gate insulating film formed on a semiconductor substrate, on a well region provided in the semiconductor substrate, or on a semiconductor film deposited on an insulator; a single gate electrode formed on the gate insulating film; two memory functional units formed on both sidewalls of the single gate electrode; a channel formation region formed under the single gate electrode; and first diffusion regions disposed on both sides of the channel formation region. The semiconductor memory cell is constituted so as to change an amount of currents flowing from one of the first diffusion regions to the other first diffusion region according to an amount of charges retained in the memory functional unit or a polarization vector when a voltage is applied to the gate electrode.

10 Claims, 26 Drawing Sheets

HEARING AID

CROSS-REFERENCE TO RELATED APPLICATION

This application is related to Japanese Patent Application No. 2003-139070 filed on May 16, 2003, whose priority is claimed under 35 USC § 119, the disclosure of which is incorporated by reference in its entirety.

BACKGROUND OF THE INVENTION

1. Field of the Invention

The present invention relates to a hearing aid. More specifically, the present invention relates to a hearing aid which is provided with a semiconductor memory cell including a field effect transistor having the function of converting a change in an amount of charges or polarization to an amount of currents, and to a hearing aid capable of adjusting its characteristics in accordance with a user and a usage environment.

2. Description of the Related Art

FIG. 26 shows the configuration of a conventional hearing aid having a digital signal processing function. This hearing aid 50 includes a central processing unit (CPU) 56, a data memory 57, a digital processing circuit 53, an A/D converter 52, a D/A converter 54, an amplification circuit 55, an output circuit 58, a microphone 51 and a loudspeaker 59. When a sound is inputted to the hearing aid 50 from the microphone 51, a sound signal outputted from the microphone 51 is amplified by the amplification circuit 55, converted from the analog signal to a digital signal by the A/D converter 52, processed by the digital processing circuit 53 to be suited to user's characteristics, converted from the digital signal to an analog signal by the D/A converter 54, and outputted to the loudspeaker 59 through the output circuit 58. Further, on the basis of a series of parameters that determine hearing aid characteristics stored in the data memory 57, the CPU 56 controls the digital processing circuit 53. In the above-described hearing aid 50, the digital processing circuit 53 converts an output level relative to an input level for each frequency band.

Following the recent improvement of the performance of the hearing aid, the hearing aid can be adjusted to a user's usage environment. Accordingly, there have been proposed an adjustment method of adjusting the hearing aid by connecting the hearing aid to a personal computer and transferring adjustment data from the personal computer to the hearing aid.

In FIG. 26, components that are required to connect the hearing aid 50 to an external adjustment apparatus (e.g., a personal computer) following the adjustment are not shown. For example, a terminal extending from the personal computer is connected to a battery contact, whereby the personal computer is connected to the CPU 56 shown in FIG. 26.

At the time of adjusting such a hearing aid, the personal computer creates the adjustment data for adjusting the characteristics of the hearing aid to be suited to the user's characteristics and transfers the adjustment data to the hearing aid 50. The adjustment data transferred to the hearing aid 50 is stored in the data memory 57. The CPU 56 controls the digital processing circuit 53 on the basis of the adjustment data stored in this data memory 57. The digital processing circuit 53 processes the sound signal so as to be suited to the user's characteristics. The hearing aid user can, therefore, listen to the sound suited to his or her characteristics.

The data memory 57 includes a rewritable semiconductor memory cell. Normally, as the rewritable semiconductor memory cell, an electrically erasable programmable ROM (EEPROM) is employed in many cases. Literatures that disclose related techniques are, for example, as follows: Japanese Patent No. 2638563, and Japanese Unexamined Patent Publication No. 2001-148899.

However, if the hearing aid includes the above-described digital processing circuit and the like, the size of the hearing aid is made large and, also, the cost thereof increases. Among the components of the hearing aid, the cost of the data memory 57 particularly occupies most of the overall cost of the hearing aid 50. Therefore, the cost hike of this data memory 57 poses a significant problem.

SUMMARY OF THE INVENTION

The present invention provides a reduced cost hearing aid including a data memory that includes a plurality of semiconductor memory cells, wherein the semiconductor memory cell includes: a gate insulating film formed on a semiconductor substrate, on a well region provided in the semiconductor substrate, or on a semiconductor film disposed on an insulator; a single gate electrode formed on the gate insulating film; two memory functional units formed on both sidewalls of the single gate electrode; a channel formation region formed under the single gate electrode; and first diffusion regions disposed on both sides of the channel formation region, and the semiconductor memory cell is constituted so as to change an amount of currents flowing from one of the first diffusion regions to the other first diffusion region according to an amount of charges retained in the memory functional unit or a polarization vector when a voltage is applied to the gate electrode.

According to the semiconductor memory cell in the hearing aid having the above configuration, a memory function of the memory functional unit is separated from a transistor operation function of the gate insulating film. Therefore, it is possible to make the gate insulating film to be thin, and to suppress a short channel effect. Accordingly, the semiconductor memory cell can be easily reduced in size, and a unit cost per bit can be reduced. Consequently, the cost of the data memory constructed by the plurality of semiconductor memory cells can be reduced. Accordingly, the cost of the hearing aid including the data memory can be reduced.

Herein, the first diffusion regions mean source/drain diffusion regions, and normally indicate a source diffusion region and a drain diffusion region, source diffusion regions, or drain diffusion regions of a field-effect transistor.

While the semiconductor film is disposed (1) on the semiconductor substrate, (2) on the well region provided in the semiconductor substrate, or (3) on the insulator, the gate insulating film is formed on the semiconductor film.

The present invention also provides a hearing aid including a semiconductor device in which a data memory and a logic circuit are disposed on one semiconductor substrate, wherein the data memory is constructed by a semiconductor memory cell, the logic circuit is constructed by a semiconductor switching cell, each of the semiconductor memory cell and the semiconductor switching cell includes: a gate electrode formed on the semiconductor substrate via a gate insulating film; a channel formation region formed under the gate electrode; a pair of first diffusion regions disposed on both sides of the channel formation region and having a conductive type opposite to that of the channel formation region; and memory functional units disposed on sidewalls of the gate electrode and including a charge retaining part having the function of retaining charges and a dissipation preventing insulator having the function of suppressing dissipation of the charges, and the semiconductor memory cell is constituted so as to change an amount of currents flowing from one of the first diffusion regions to the other first diffusion region according to an amount of charges retained in the memory functional unit when a voltage is applied to the gate electrode.

According to this hearing aid of the present invention, a charge retaining unit is not formed in the region which functions as the gate insulating film but formed on a sidewall of the gate electrode. Therefore, the number of manufacturing steps of the semiconductor device in which the semiconductor memory cell and the semiconductor switching cell are mounted on one semiconductor substrate can be greatly decreased. Namely, the semiconductor memory cell is almost equal in structure to the semiconductor switching cell except that only the semiconductor memory cell is constituted so as to change a quantity of reading currents as need. This difference does not cause a considerable increase in the number of steps as seen in the conventional combination process for mounting an EEPROM and a logic circuit on one chip. Therefore, as compared with the conventional combination process for the EEPROM and the semiconductor switching cell, a manufacturing cost can be considerably reduced.

One embodiment of the present invention has a feature in that the data memory and the logic circuit are formed on one chip.

According to this embodiment, since the data memory and the logic circuit are formed on one chip, the number of chips included in the hearing aid decreases and the cost of the hearing aid is thereby reduced. Further, since a process of forming the semiconductor memory cell that constitutes the data memory is quite similar to a process of forming the cell that constitutes the logic circuit, the combination process for mounting both of the cells on one chip is easily carried out. Therefore, an effect of the cost reduction owing to the formation of the logic circuit and the data memory on one chip can be particularly increased.

Further, one embodiment of the present invention has a feature in that the data memory can store a program for prescribing an operation of the logic circuit and a set of parameters for determining hearing aid characteristics, the program uses the set of parameters, and the program and the parameters are rewritable from the outside.

According to this embodiment, since the memory function of the memory functional unit is separated from the transistor operation function of the gate insulating film, it is possible to make the gate insulating film thin and to suppress the short channel effect. This can facilitate reduction in size of the semiconductor memory cell and reduce the unit cost per bit. Thus, the cost of the data memory including the plurality of semiconductor memory cells. Therefore, the cost of the hearing aid that includes the data memory can be reduced. Furthermore, the parameters used by the program are rewritable from the outside. Therefore, by rewriting the parameters as needed, signal amplification according to, for example, each user's characteristics can be made and the function of the hearing aid can be rapidly improved. The program is rewritable, as well. Therefore, if a new program having an improved function is created, the previous program is rewritten to the new program without purchasing a new hearing aid, whereby the user can continuously use the same hearing aid.

The present invention also provides a hearing aide having a feature in that the data memory includes a controller that stores a plurality of sets of parameters for determining hearing aid characteristics, that analyzes an input signal inputted to a logic circuit, and that selects one of the sets of parameters used to determine the hearing aid characteristics.

With this configuration, since the memory function of the memory functional unit is separated from the transistor operation function of the gate insulating film, it is possible to make the gate insulating film thin and to suppress the short channel effect. This can facilitate reduction in size of the semiconductor memory cell, reduce the unit cost per bit, and reduce the cost of the data memory including the plurality of semiconductor memory cells. It is also possible to reduce the cost of the hearing aid that includes the data memory. Further, by appropriately selecting the set of parameters based on the input signal, a noise can be reduced and a conversation sound and an alarm sound are amplified in, for example, a noisy environment, or if a specific conversation sound is inputted, the sound can be amplified. Thus, it is possible to use the parameters for different hearing aid characteristics according to the environment, and to further rapidly improve the function of the hearing aid.

In addition, two bits of information may be stored in the one semiconductor memory cell.

With this configuration, a cell area per bit is reduced in half and the area of the data memory can be further reduced. Therefore, the cost of the hearing aid can be further reduced.

In addition, the memory functional unit may be made of a first insulator, a second insulator and a third insulator, the first insulator may have a function of accumulating charges and, also, have a structure in which the first insulator is sandwiched between the second insulator and the third insulator, the first insulator may be made of silicon nitride, and each of the second and third insulators may be made of silicon oxide.

With this configuration, the first insulator is made of silicon nitride. Therefore, the leak of the retained charges less occurs to the semiconductor memory cell, the retaining characteristics of the semiconductor memory cell are good, and the reliability thereof is high. Further, each of the second and third insulators is made of silicon oxide. Therefore, a manufacturing process for the semiconductor memory cell has a high affinity to a present LSI process, whereby it is possible to easily provide the semiconductor memory cell at a low cost. Consequently, it is possible to improve the reliability of the hearing aid which uses this semiconductor memory cell, and to reduce the cost of the hearing aid.

In addition, a film made of the second insulator on the channel formation region may be thinner than the gate insulating film and may be 0.8 nm or more.

With this configuration, a power supply voltage of the hearing aid can be lowered, and reduction in power consumption of the hearing aid can be thereby realized.

In addition, a film made of the second insulator on the channel formation region may be thicker than the gate insulating film and may be 20 nm or less.

With this configuration, it is possible to increase a storage capacity of the data memory in the hearing aid to thereby improve the function of the data memory, and to reduce the manufacturing cost of the hearing aid.

In addition, a film made of the first insulator may include a portion having a surface almost in parallel to a surface of the gate insulating film.

With this configuration, the reliability of the hearing aid can be improved.

In addition, the film made of the first insulator may include a portion extending almost in parallel to a side surface of the gate electrode.

With this configuration, time for rewriting the parameters of the hearing aid can be shortened.

In addition, a part of or all of the memory functional unit may be formed to be overlapped with a part of the first diffusion region.

With this configuration, reduction in power consumption of the hearing aid can be realized.

DETAILED DESCRIPTION OF THE INVENTION

Hereinafter, the present invention will be described with reference to the drawings. It should be noted that the present invention is not limited by the following description.

Figure 26:
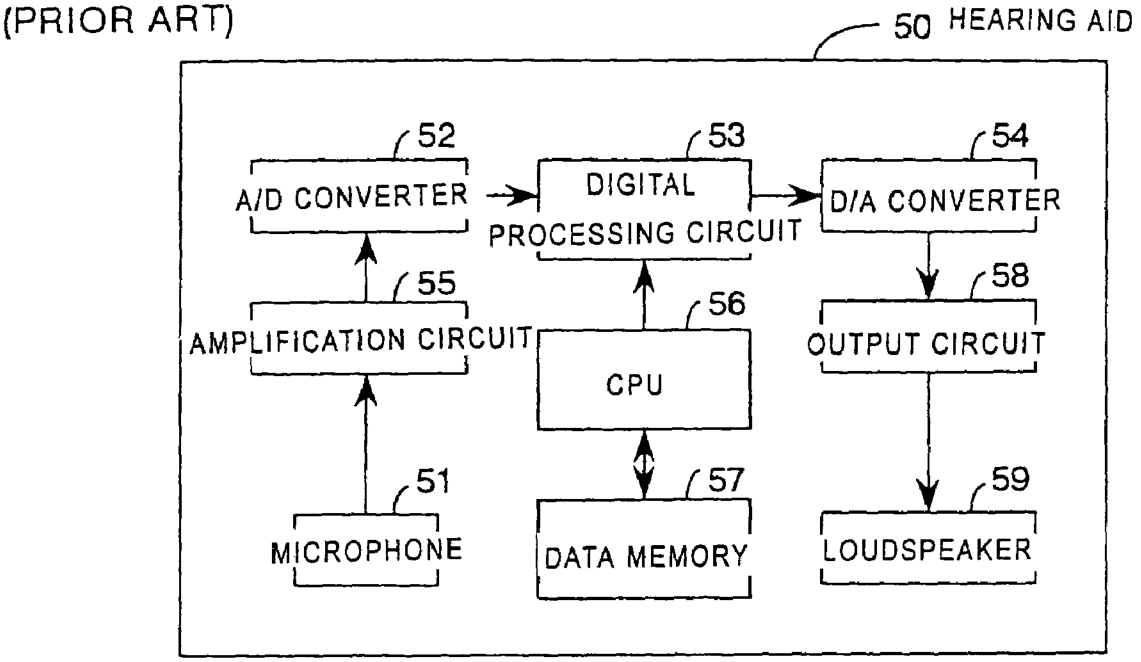
FIG.26 (PRIOR ART)
FIG. 26 is a block diagram showing the configuration of a conventional hearing aid.

In a block diagram, a hearing aid according to the present invention has the same configuration as that of the conventional hearing aid shown in FIG. 26. In addition, the hearing aid according to the present invention has the same function of adjusting the characteristics of the hearing aid to be suited to user's characteristics as that of the conventional hearing aid. However, the present invention is characterized particularly in that a data memory has characteristic internal configuration so as to solve the conventional problems.

A semiconductor memory cell used for the data memory 57 in the hearing aid according to the present invention will first be described. FIGS. 1A to 1D show the schematic configuration of the semiconductor memory cell according to the present invention.

The semiconductor memory cell that constitutes the semiconductor device in this embodiment is a semiconductor memory cell capable of storing data of two bits. As shown in FIGS. 1A to 1D, a gate electrode 3 is formed on a semiconductor substrate 1 via a gate insulating film 2. A sidewall-shaped memory functional unit 11 is formed on each sidewall of a gate stack 8 constructed by the gate insulating film 2 and the gate electrode 3. A source/drain diffusion region 13 is formed below the memory functional unit 11. This source/drain diffusion region 13 is offset from an end of the gate electrode 3.

This source/drain diffusion region 13 corresponds to the first diffusion region.

Specifically, on a surface of the semiconductor substrate 1 in a channel direction, the source/drain diffusion region 13 is not present below the gate electrode 3 and there is a gap between the end of the gate electrode 3 and the source/drain diffusion region 13 by as much as a width of an offset region 20. In other words, a channel region 19 between the source and drain regions is disposed under the memory functional unit 11 on the surface of the semiconductor substrate 1 by the width of the-offset region 20. This enables efficient injection of electrons and positive holes into the memory functional unit 11, and formation of the semiconductor memory cell having high writing and erasing speeds.

Further, by disposing the source/drain diffusion region 13 to be offset from the gate electrode 3, easiness of inversion of the offset region 20 under the memory functional unit 11 when a voltage is applied to the gate electrode 3 can be largely changed according to the amount of charges accumulated in the memory functional unit 11, and a memory effect can be increased. Furthermore, as compared with a semiconductor switching cell, this semiconductor memory cell can strongly prevent a short channel effect, and a further reduction in a gate length can be achieved. The semiconductor memory cell is structurally suitable for the suppression of the short channel effect. Therefore, as compared with a logic transistor, the semiconductor memory cell can use a thick gate insulating film and reliability thereof can be improved.

Furthermore, the memory functional unit 11 of the semiconductor memory cell is formed independently of the gate insulating film 2. Therefore, the memory function of the memory functional unit 11 is separated from a transistor operation function of the gate insulating film 2, and the gate insulating film 2 can be made thin, thereby making it possible to realize reduction in voltage and reduction in size. In addition, a material suitable for the memory function of the memory functional unit 11 can be selected and the memory functional unit 11 can be formed by the selected material.

Now, the memory functional unit 11 and components thereof will be defined as follows.

Figure 1A:
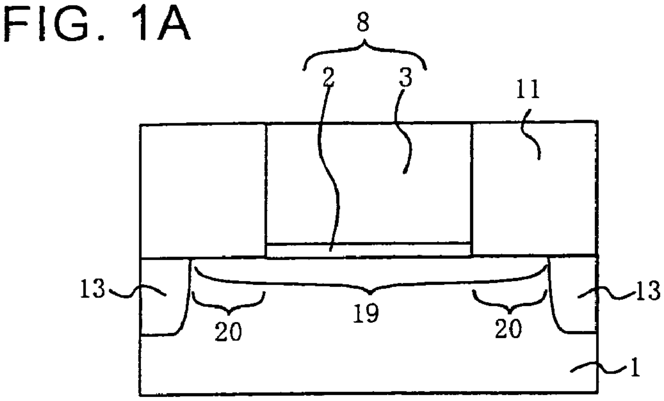
FIGS. 1A to 1D are schematic sectional views showing one embodiment of a semiconductor memory cell used for a hearing aid according to the present invention.
Figure 1B:
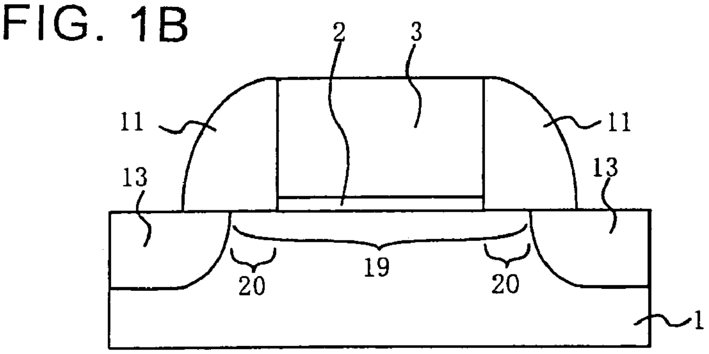
Figure 1C:
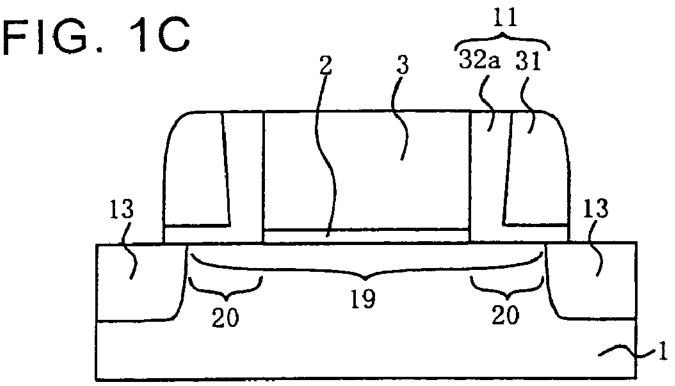
Figure 1D:
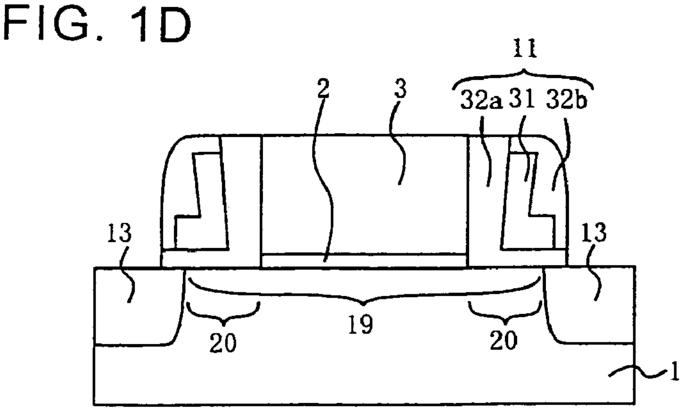

As shown in FIGS. 1A to 1D, the memory functional unit 11 refers to a region formed on each side of the gate electrode 3 and having the function of accumulating charges. The memory functional unit 11 is constructed by a charge retaining part and a dissipation preventing insulator. As shown in FIG. 1C or 1D, the memory functional unit 11 can be constructed by the charge retaining part 31 which is a region capable of accumulating charges, and a first insulator 32*a* capable of preventing the dissipation of charges. As shown in FIG. 1D, the memory functional unit can be constructed by the charge retaining part 31 capable of retaining charges, and the first insulator 32*a* and a second insulator 32*b* both capable of preventing the dissipation of charges.

However, a boundary between the first insulator 32*a* and the second insulator 32*b* is not particularly necessary but the boundary is provided simply for convenience sake. Namely, in the case where the first and second insulators 32*a* and 32*b* are made of the same material, they cannot be substantially distinguished from each other. Needless to say, even in that case, the semiconductor memory cell can exhibit the effects of the present invention. The portion constructed by the first insulator or both the first and second insulators will be also referred to as a dissipation preventing insulator.

As shown in FIGS. 1C and 1D, the first insulator 32*a* is not always uniform in thickness but an upper portion of the first insulator 32*a* is thicker than a lower portion thereof or vice versa in some cases. Needless to say, even in that case, the semiconductor memory cell can exhibit the effects of the present invention. However, in the case where the upper portion is thicker than the lower portion, effects of suppressing the injection of unnecessary charges from the gate electrode 3 in the upper portion of the first insulator 32*a*, and of making the insulating film 2 thinner so as to increase an influence of the retained charges on the offset region 20, as compared with the first insulator 32*a* having the uniform thickness can be exhibited.

The semiconductor memory cell will now be described.

The semiconductor memory cell of the present invention is mainly constructed by the gate insulating film, the gate electrode formed on the gate insulating film, the memory functional units formed on both sides of the gate electrode, the source/drain diffusion regions each disposed on the opposite side of each memory functional unit to the gate electrode-side thereof, and a channel formation region disposed under the gate electrode.

This semiconductor memory cell functions as a semiconductor memory cell that stores four or more levels of information by storing two or more levels of information in each memory functional unit. This semiconductor memory cell does not necessarily function by storing the four or more levels of information but may function by storing, for example, two levels of information.

The semiconductor memory cell of the present invention is formed on the semiconductor substrate, preferably on a well region of a first conductive type formed in the semiconductor substrate.

The semiconductor substrate is not particularly limited as long as it can be used for the semiconductor device, and examples thereof include substrates made of element semiconductors such as silicon and germanium and of compound semiconductors such as GaAs, InGaAs and ZnSe, and various substrates such as an SOI substrate and a multilayer SOI substrate. Further, a glass or plastic substrate having a semiconductor layer thereon may be used. In particular, the silicon substrate or the SOI substrate having the silicon layer formed thereon as a surface semiconductor layer is preferable. The semiconductor substrate or semiconductor layer may be single crystal (formed by, for example, epitaxial growth), polycrystal, or amorphous although an amount of a current flowing therein varies slightly differently.

On the semiconductor layer, preferably, a device isolation region is formed. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. Impurity concentration in the semiconductor layer and the well region which is within a known range in this field can be used. In the case of using the SOI substrate as the semiconductor layer, the well region may be formed in the surface semiconductor layer and a body region may be provided below a channel region.

The gate insulating film is not particularly limited as long as it is usually used for a semiconductor device, and an example thereof include a single-layer film or a laminated film of an insulating film such as a silicon oxide film or a silicon nitride film, or a high dielectric constant film such as an aluminum oxide film, a titanium oxide film, a tantalum oxide film or a hafnium oxide film. Particularly, a silicon oxide film is preferable. The gate insulating film has a thickness of, for example, about 1 to 20 nm, preferably, about 1 to 6 nm. The gate insulating film may be formed only immediately below the gate electrode or formed so as to be larger (wider) than the gate electrode.

The gate electrode is formed on the gate insulating film in a shape which is usually used for the semiconductor device. The gate electrode is not particularly limited unless specified otherwise, and examples of thereof include conductive films, for example, single-layer or laminated films made of polysilicon, metal such as copper or aluminum, high-refractory metal such as tungsten, titanium or tantalum, and silicide or the like with the high refractory metal. Suitable thickness of the gate electrode is, for example, about 50 to 400 nm. Under the gate electrode, the channel formation region is formed. The channel formation region is preferably formed not only under the gate electrode but also under a region including the gate electrode and outside of gate ends in a gate length direction. In the case where the channel formation region that is not covered with the gate electrode is present, the channel formation region is preferably covered with either the gate insulating film or the memory functional units to be described later.

The memory functional unit is constructed by including a film or a region having at least the function of retaining charges, the function of accumulating and retaining charges, or the function of trapping charges. Examples of the material for the memory functional unit having the above function include silicon nitride; silicon; a silicate glass including impurities such as phosphorus or boron; silicon carbide; alumina; high dielectric materials such as hafnium oxide, zirconium oxide and tantalum oxide; zinc oxide; and metals. The memory functional unit can be formed by, for example, a single-layer or laminated structure of an insulating film including a silicon nitride film, an insulating film including therein a conductive film or a semiconductor layer, or an insulating film including at least one conductor or semiconductor dot. In particular, it is preferable to use the silicon nitride film. This is because the silicon nitride film can obtain large hysteretic characteristics since a number of levels of trapping charges exist. In addition, charge retention time is long and a problem of charge leakage due to generation of a leak path does not occur, so that the retaining characteristics of the silicon nitride film are good. Further, silicon nitride is a material which is used quite typically in an LSI process.

By using the insulating film including therein an insulating film having the charge retaining function such as the silicon nitride film as the memory functional unit, the reliability of the semiconductor memory cell in respect of storage and retention can be enhanced. Since the silicon nitride film is an insulator, even when a charge leak occurs to a part of the silicon nitride film, the charges in the whole silicon nitride film are not lost immediately. In the case of arranging a plurality of semiconductor memory cells, even when the distance between the semiconductor memory cells is shortened and neighboring memory cells come into contact with each other, the information stored in the memory functional units is not lost, differently from the semiconductor memory cell having the memory functional units made of conductors. Further, a contact plug can be disposed closer to the memory functional unit. In some cases, the contact plug can be disposed so as to be overlapped with the memory functional unit. This facilitates the reduction in size of the semiconductor memory cell.

In order to increase the reliability of the semiconductor memory cell with respect to storage and retention, it is not necessary that the insulating film having the function of retaining charges have a film shape. Preferably, insulators each having the function of retaining charges are present discretely in the insulating film. In particular, it is preferable that insulators each having the charge retaining function in the shape of dots are spread in a material which less easily retains charges, for example, the silicon oxide.

When the insulating film including therein the conductive film or semiconductor layer is used as the memory functional unit, an amount of charges injected into the conductor or semiconductor can be freely controlled, so that multilevel values can be easily obtained.

Further, when the insulating film including at least one conductor or semiconductor dot is used as the memory functional unit, it is easier to perform writing and erasing by direct tunneling of charges, so that reduction in power consumption can be advantageously achieved.

Namely, it is preferable that the memory functional unit further includes a film having a region or film of suppressing escape charges. Examples of the film having the function of suppressing escape of charges include the silicon oxide film and the like.

The memory functional units are formed on both sides of the gate electrode directly or via the insulating film, and are disposed on the semiconductor substrate (the well region, the body region or the source/drain diffusion region) directly or via the gate insulating film or the insulating film. The charge retaining films on both sides of the gate electrode may be formed so as to cover all or a part of the sidewalls of the gate electrode directly or via the insulating film. In the case where the conductive film is used as the charge retaining film, it is preferable that the charge retaining film is disposed via the insulating film so that the charge retaining film is not in direct contact with the semiconductor substrate (the well region, the body region or the source/drain diffusion region) or the gate electrode. Examples of the structure of the memory functional unit include a laminated structure of the conductive film and the insulating film, a structure in which conductive films in the form of dots are spread in the insulating film, and a structure in which the conductive film is disposed in a part of sidewall insulating films formed on sidewalls of the gate.

The memory functional unit preferably has a sandwich structure in which a film made of the first insulator that accumulates charges is sandwiched between a film made of the second insulator and a film made of a third insulator. Since the first insulator that accumulates charges is in the form of a film, it is possible to increase a density of charges in the first insulator in shorter time by the injection of charges and to make the density of charges uniform. In the case where charge distribution in the first insulator that accumulates charges is not uniform, there is a possibility that the charges move in the first insulator while being retained, and that the reliability of the semiconductor memory cell is deteriorated. Further, since the first insulator that accumulates charges is isolated from the conductor parts (the gate electrode, the source/drain diffusion region and the semiconductor substrate) by the other insulating film, the charge leak can be suppressed and sufficient charge retaining time can be secured.

Accordingly, in the case where the film made of the first insulator has the sandwich structure, it is possible to ensure the high-speed rewriting performance of the semiconductor memory cell, the improvement of the reliability of the semiconductor memory cell, and securing the sufficient charge retaining time. In order for the memory functional unit to satisfy these conditions, it is preferable that the first insulator is the silicon nitride film and that the second and third insulators are silicon oxide films. Since the silicon nitride film has a number of levels of trapping charges, large hysteretic characteristics can be obtained. Since the silicon oxide film and the silicon nitride film are typical materials used in the LSI process, they are preferable materials. Alternatively, hafnium oxide, tantalum oxide, yttrium oxide or the like can be used as the material for the first insulator instead of silicon nitride. Aluminum oxide or the like can be used as the material for the second and third insulators instead of silicon oxide. The second and third insulators may be made of different materials or the same material.

The memory functional units are formed on the both sides of the gate electrode and disposed on the semiconductor substrate (the well region, the body region or the source/drain diffusion region). The charge retaining films included in the memory functional units are formed on the both sides of the gate electrode directly or via the insulating film, and disposed on the semiconductor substrate (the well region, the body region or the source/drain diffusion region) directly or via the gate insulating film or the insulating film. The charge retaining films on both sides of the gate electrode are preferably formed to cover all or a part of the sidewalls of the gate electrode directly or via the insulating film. In an application example, in the case where the gate electrode has a recess in its lower end, the charge retaining film may be formed so as to completely or partially bury the recess directly or via an insulating film.

Preferably, the gate electrode is formed only on the sidewall of each memory functional unit or does not cover an upper portion of the memory functional unit. With this structure, a contact plug can be disposed closer to the gate electrode, so that the reduction in size of the semiconductor memory cell is facilitated. It is easy to manufacture the semiconductor memory cell having such simple structure, so that the yield can be improved.

The source/drain diffusion regions are disposed, as diffusion regions of the conductive type opposite to that of the semiconductor substrate or well region, on the opposite sides of the respective memory functional units to the gate electrode-sides thereof. In a junction between each source/drain diffusion region and the semiconductor substrate or well region, preferably, the impurity concentration is sharp. This is because hot electrons or hot holes are generated efficiently at a low voltage, and high-speed operation can be performed at a lower voltage. A junction depth of the source/drain diffusion region is not particularly limited and can be appropriately adjusted in accordance with the performance or the like of the semiconductor memory cell to be obtained. In the case of using the SOI substrate as the semiconductor substrate, the source/drain diffusion region may have a junction depth smaller than a thickness of the surface semiconductor layer. It is preferable that the diffusion region has the junction depth almost the same as that of the surface semiconductor layer.

The source/drain diffusion region may be disposed so as to be overlapped with one end of the gate electrode, or so as to be offset from one end of the gate electrode. It is more preferable to dispose the source/drain diffusion region offset from one end of the gate electrode. This is because the easiness of inversion of the offset region below the charge retaining film largely changes in accordance with the amount of charges accumulated in the memory functional unit when the voltage is applied to the gate electrode, the memory effect increases and the short channel effect is reduced. However, when the diffusion region is offset excessively, a drive current between the source/drain diffusion regions decreases conspicuously. Therefore, it is preferable that the offset amount, that is, a distance to the source/drain diffusion region closer to one end of the gate electrode end in the gate length direction is smaller than the thickness of the charge retaining film in a direction parallel to the gate length direction.

It is particularly important that at least a part of a charge accumulation region in the memory functional unit is overlapped with a part of the source/drain diffusion region serving as a diffusion layer region. By overlapping even a part of the charge accumulation region therewith, it is possible to greatly increase the drive current as compared with a case where the source/drain diffusion region is not overlapped therewith. It is thereby possible to relatively reduce the voltage and to provide the semiconductor memory cell with low power consumption.

Accordingly, the offset amount may be determined so that both the memory effect and the drive current are appropriate.

A part of the diffusion region may extend at a level higher than the surface of the channel region or the under face of the gate insulating film. In this case, it is suitable that, on the diffusion region formed in the semiconductor substrate, the conductive film integrated with the diffusion region is laminated. The conductive film is made of semiconductor such as polysilicon or amorphous silicon, silicide, the above-described metals, high-refractory metals, or the like. In particular, polysilicon is preferred. Since impurity diffusion speed of polysilicon is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional unit in cooperation with the gate electrode.

The semiconductor memory cell of the present invention performs writing, erasing and reading operations by applying predetermined potentials to the single gate electrode formed on the gate insulating film, the source region, the drain region and the semiconductor substrate as four terminals, respectively. Concrete examples of an operation principle and an operation voltage will be described later. In the case where a plurality of semiconductor memory cells of the present invention are arranged in an array to constitute a memory cell array, each memory cell can be controlled by a single control gate. The number of word lines can be therefore decreased.

The semiconductor memory cell of the present invention can be formed by the same method as a method of forming, for example, a semiconductor memory cell sidewall spacer having a stacked structure on each sidewall of the gate electrode by an ordinary semiconductor process. Specifically, an example of the formation method includes a method wherein, after forming the gate electrode, laminated films of an insulating film (second insulator)/a charge accumulation film (first insulator)/an insulating film (second insulator) are formed, etched back under appropriate conditions, and left in the form of the semiconductor memory cell sidewall spacer. Additionally, conditions and depositions at the time of forming the sidewall may be appropriately selected in accordance with the structure of a desired memory functional unit.

DESCRIPTION OF THE PREFERRED EMBODIMENTS

Specific embodiments of the semiconductor memory cell used for the hearing aid of the present invention will now be described.

First Embodiment

Figure 5:
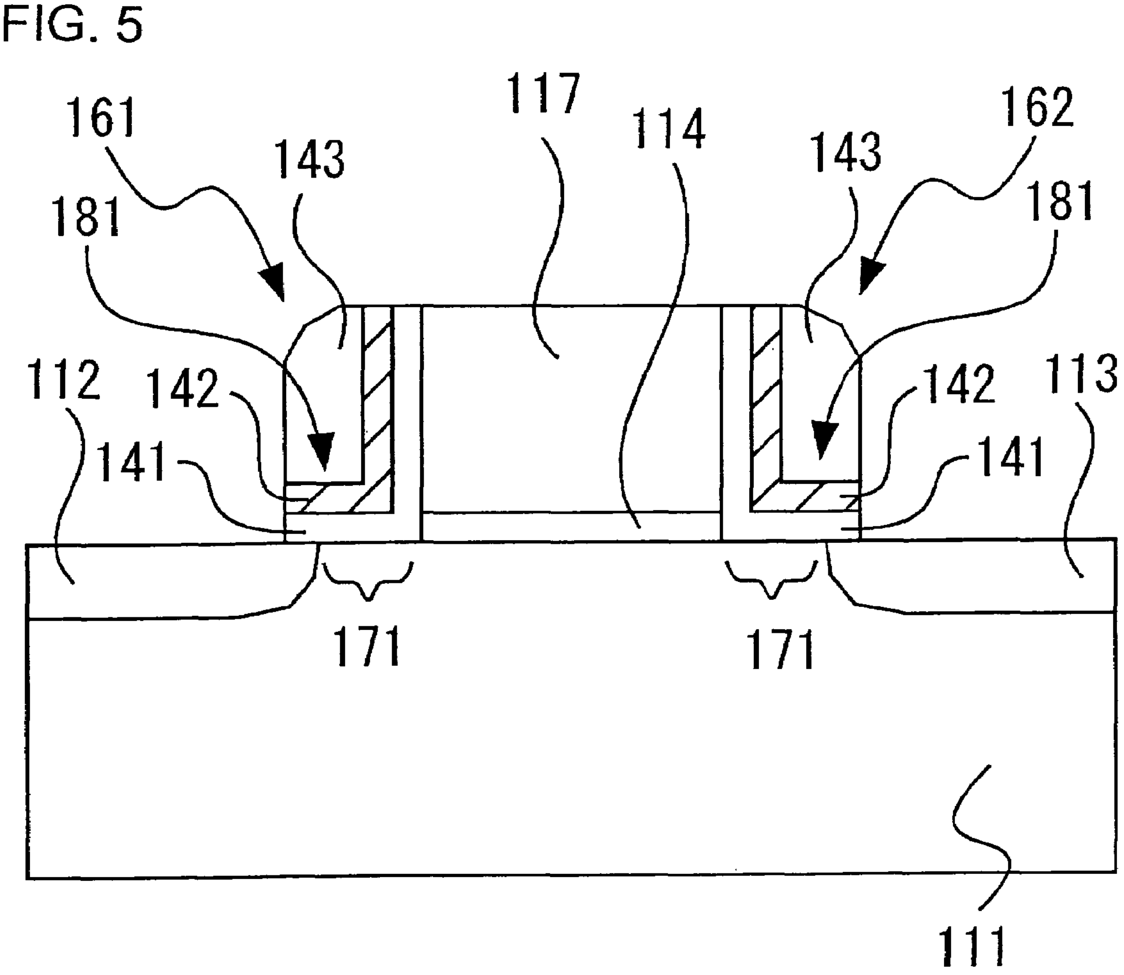
FIG. 5 is a schematic sectional view showing a main part of a semiconductor memory cell (first embodiment) used for the hearing aid according to the present invention.

As shown in FIG. 5, the semiconductor memory cell in this embodiment is constructed by a region in which memory functional units 161 and 162 retain charges (which may be a region that accumulates charges or a film having the function of retaining charges), and a region that suppresses escape of charges (which may be a film having the function of suppressing escape of charges). The semiconductor memory cell has, for example, an ONO structure. Namely, a silicon nitride film 142 is put between silicon oxide films 141 and 143, and the silicon oxide film 141, the silicon nitride film 142 and the silicon oxide films 143 constitute each of the memory functional units 161 and 162. The silicon nitride film 142 functions to retain charges. Each of the silicon oxide films 141 and 143 functions as the film that has the function of suppressing escape of the charges accumulated in the silicon nitride film 142.

The charge retaining region (the silicon nitride film 142) in each of the memory functional units 161 and 162 is overlapped with source/drain diffusion region 112 or 113. "The region is overlapped" means herein that at least part of the charge retaining region (the silicon nitride film 142) is present on at least part of the region of the source/drain diffusion region 112 or 113. In FIG. 5, 111 denotes a semiconductor substrate, 114 denotes a gate insulating film, 117 denotes a gate electrode, and 171 denotes an offset region (between the gate electrode 117 and the source/drain diffusion region 112 or 113). An uppermost surface portion of the semiconductor substrate 111 below the gate insulating film 114 is a channel formation region (not shown).

An effect attained by overlapping the charge retaining region 142 with the source/drain diffusion region 112 or 113 in the memory functional unit 161 or 162 will be described.

Figure 6:
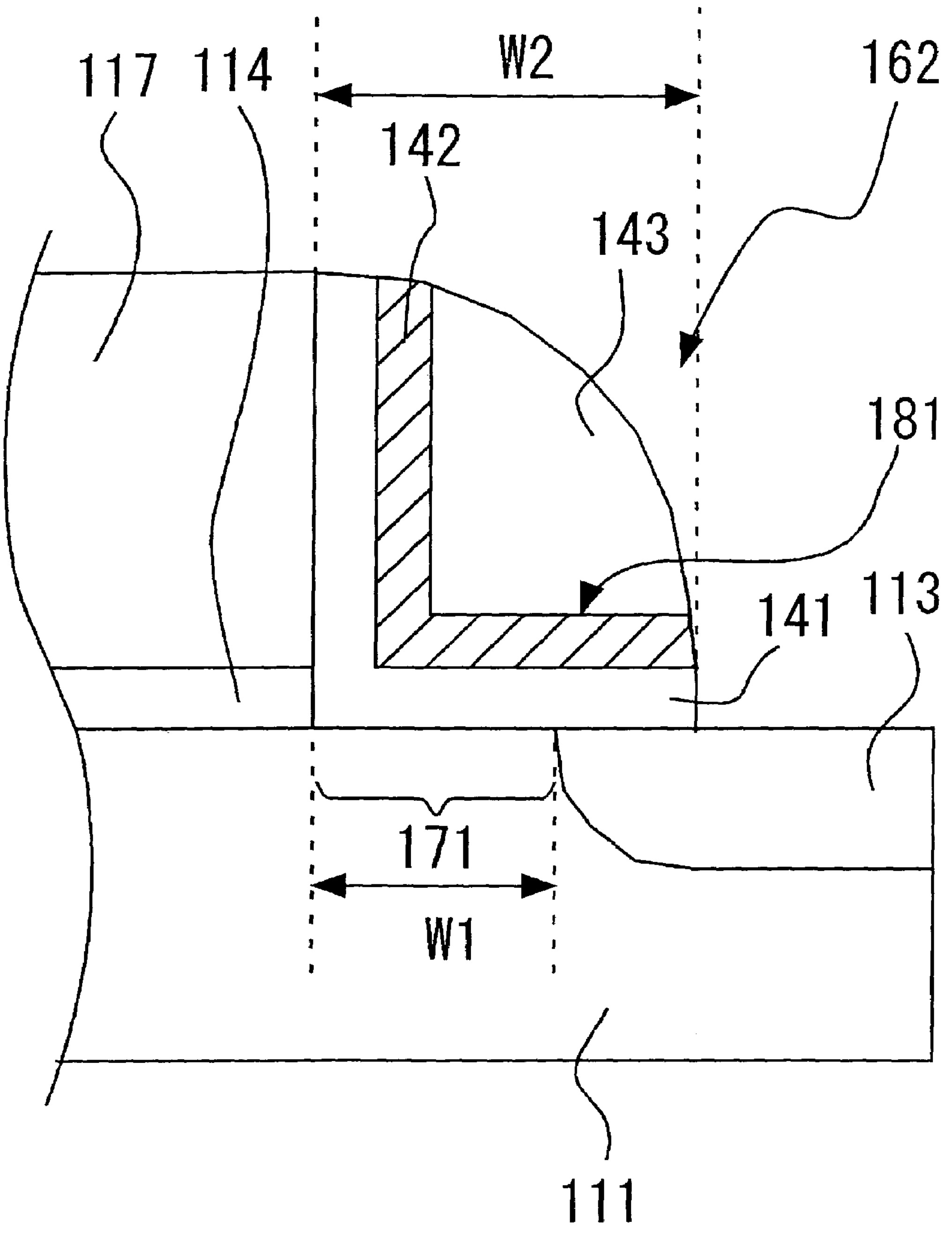
FIG. 6 is an enlarged schematic sectional view showing the main part in FIG. 5.

FIG. 6 is an enlarged view which shows peripheral portions of the memory functional unit 162 located on the right in FIG. 5. In FIG. 6, W1 denotes an offset amount by which the gate electrode 114 is offset from the source/drain diffusion region 113. In addition, W2 denotes a width of the memory functional unit 162 in a cross section of the gate electrode 114 in the channel length direction. The width of the memory functional unit 162 is defined as W2 because an end of the silicon nitride film 142 in the memory functional unit 162 on a side away from the gate electrode 117 coincides with an end of the memory functional unit 162 on a side away from the gate electrode 117. An overlap amount by which the memory functional unit 162 is overlapped with the source/drain diffusion region 113 is expressed by W2−W1. It is particularly important herein that the silicon nitride film 142 in the memory functional unit 162 is overlapped with the source/drain diffusion region 113, i.e., a relation of W2>W1 is satisfied.

Figure 7:
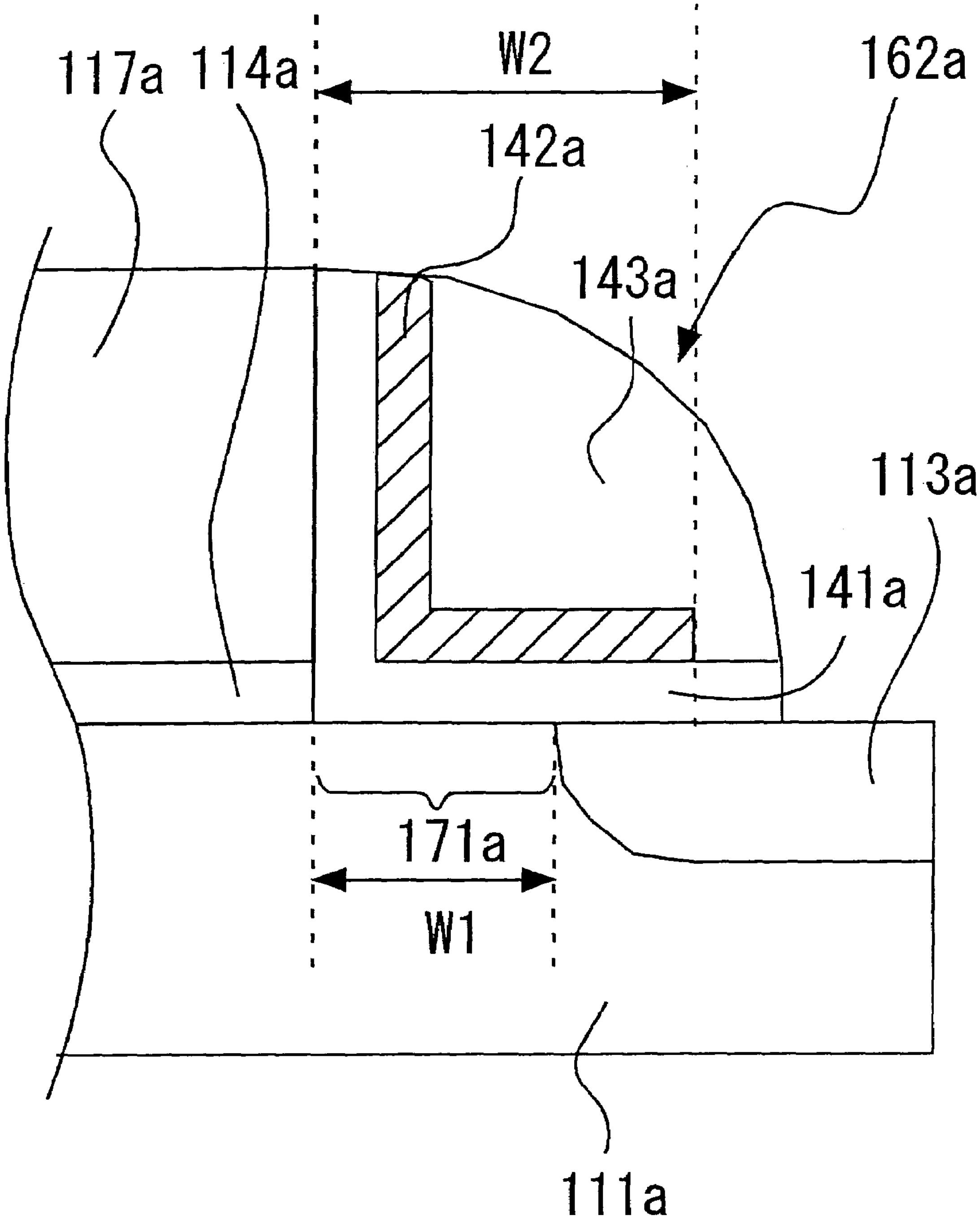
FIG. 7 is an enlarged schematic sectional view showing a modification of the main part in FIG. 5.

As shown in FIG. 7, if an end of a silicon nitride film 142*a* in a memory functional unit 162*a* on a side away from a gate electrode 117*a* does not coincide with an end of the memory functional unit 162*a* on a side away from the gate electrode 117*a*, the width W2 may be defined from the end of the gate electrode 117*a* to the end of the silicon nitride film 142*a* on the side away from the gate electrode 117*a*.

Figure 8:
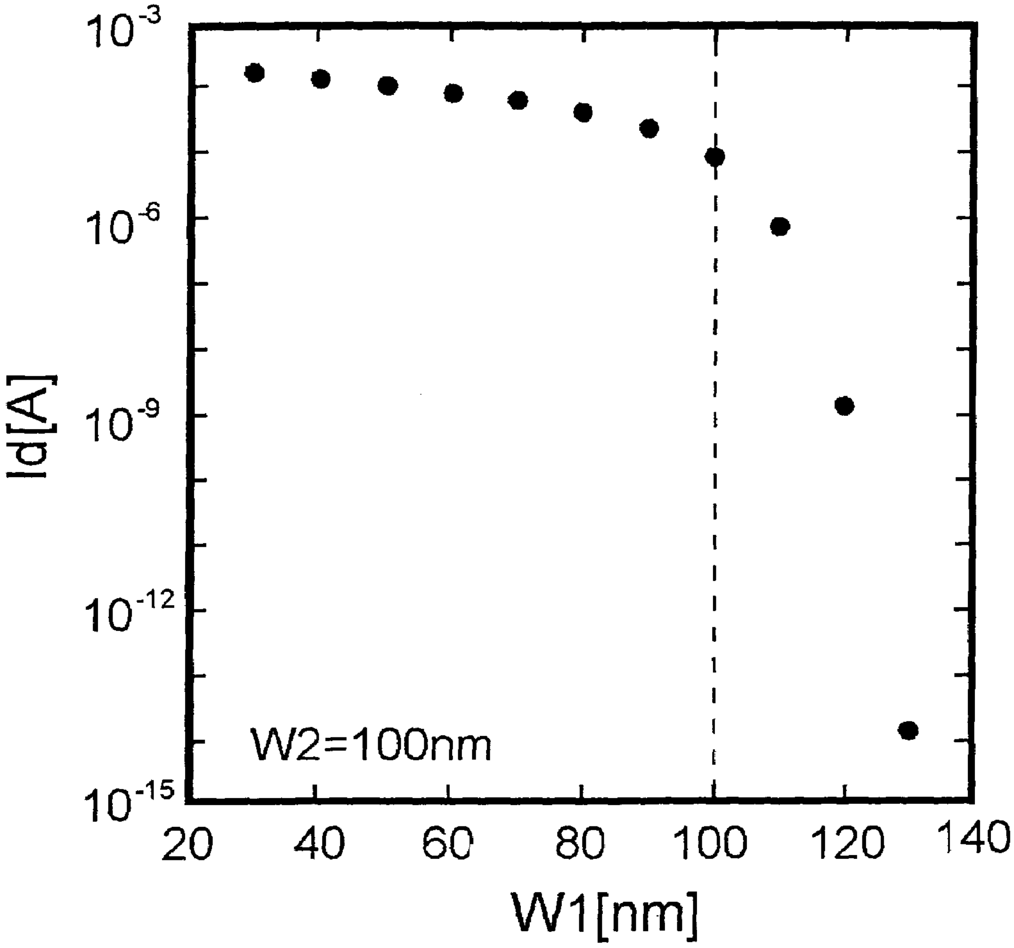
FIG. 8 is a graph showing electric characteristics of the semiconductor memory cell (first embodiment) used for the hearing aid according to the present invention.

FIG. 8 shows a drain current Id when the width W2 of the memory functional unit 162 is fixed to 100 nm and the offset amount W1 is changed in the structure shown in FIG. 6. In FIG. 8, the drain current Id is determined by a device simulation on assumption that the memory functional unit 162 is an erasing state (in a state where positive holes are accumulated), and that the source/drain diffusion regions 112 and 113 are a source electrode and a drain electrode, respectively.

As is obvious from FIG. 8, in a range where the width W1 is 100 nm or more (that is, the silicon nitride film 142 and the source/drain diffusion region 113 are not overlapped with each other), the drain current Id sharply decreases. Since the drain current Id is substantially proportional to the reading operation speed, the performance of the semiconductor memory cell is sharply deteriorated with the width W1 of 100 nm or more. On the other hand, in a range where the silicon nitride film 142 is overlapped with the source/drain diffusion region 113, a decrease in the drain current Id is gentle. Therefore, it is preferable that at least part of the silicon nitride film 142 that is the film having the function of retaining charges is overlapped with the source/drain diffusion region 113.

On the basis of the result of the device simulation, the width W2 is fixed to 100 nm, the width W1 is set at 60 nm or 100 nm as a design value, and a memory cell array is produced. If the width W1 is 60 nm, the silicon nitride film 142 is overlapped with the source/drain diffusion region 112 or 113 by 40 nm as a design value. If the W1 is 100 nm, they are not overlapped with each other as a design value. A result of measuring reading time of each memory cell array demonstrates as follows. If the two memory cell arrays are compared with each other in their worst cases considering variations, the memory cell array having the width W1 set at 60 nm has access time 100 times as fast as the memory cell array having the width W1 set at 100 nm. In practice, the read access time is preferably 100 nanoseconds or less per one bit. At W1=W2, this condition cannot be satisfied by any means. If considering even manufacturing variations, it is more preferable to satisfy a relation of W2−W1>100 nm.

To read information stored in the memory functional unit 161 (the region 181), it is preferable to set the source/drain diffusion region 112 as the source electrode and set the source/drain diffusion region 113 as the drain region as described above, and to form a pinch-off point on the side closer to the drain region in the channel formation region. Specifically, at the time of reading the information stored in one of the two memory functional units 161 and 162, it is preferable to form the pinch-off point in the channel formation region closer to the other memory functional unit. This makes it possible to detect the information stored in the memory functional unit 161 with high sensitivity irrespectively of a storage state of the memory functional unit 162, which is a large factor for enabling the two-bit operation.

If the information is stored in only one of the two memory functional units 161 and 162 or the two memory functional units 161 and 162 are used while being set in the same storage state, the pinch-off point is not necessarily formed during reading.

Although not shown in FIG. 5, it is preferable to form a well region (a P-type well if the semiconductor memory cell is of an N channel type) in the surface of the semiconductor substrate 111. The formation of the well region facilitates suppressing the other electric characteristics (withstand voltage, junction capacitance and short-channel effect) while optimizing the impurity concentration of the channel formation region to the memory operations (rewriting and reading operations).

With a view of improving memory retaining characteristics, each of the memory functional units 161 and 162 preferably includes the charge retaining film that has the function of retaining charges, and the insulating film. In this embodiment, the silicon nitride film 142 that has a level of trapping charges is employed as the charge retaining film, and the silicon oxide films 141 and 143 that function to prevent dissipation of the charges accumulated in the charge retaining film are employed as the insulating films. If the memory functional unit includes the charge retaining film and the insulating films, it is possible to prevent dissipation of the charges and to improve the retaining characteristics. Further, as compared with a case where the memory functional unit is constructed only by the charge retaining film, a volume of the charge retaining film can be appropriately reduced. By appropriately reducing the volume of the charge retaining film, it is possible to restrict movement of charges in the charge retaining film, and to suppress occurrence of a change in characteristics due to the movement of charges while the memory functional unit stores and holds the information.

Figure 9:
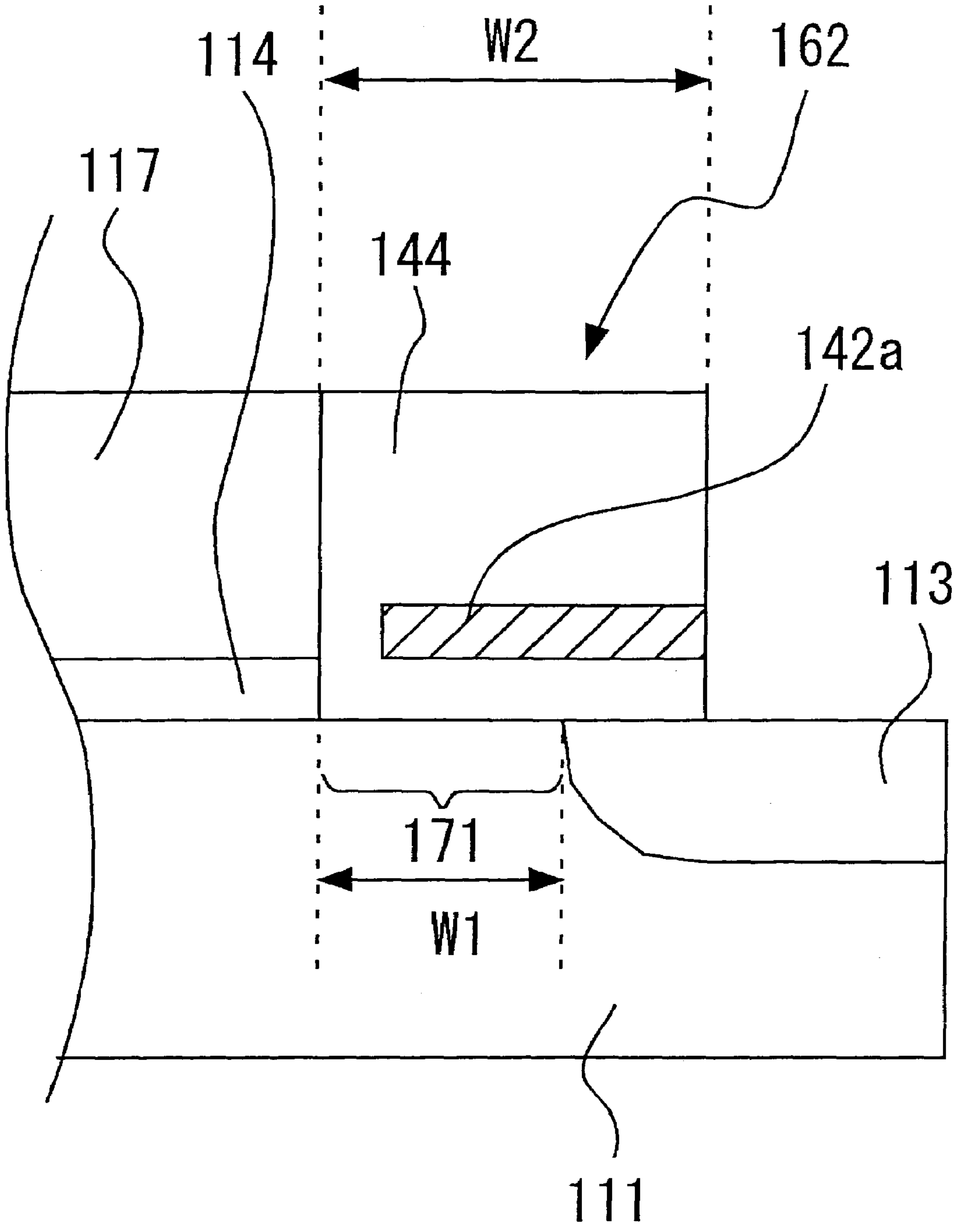
FIG. 9 is a schematic sectional view showing a main part of a modification of the semiconductor memory cell (first embodiment) used for the hearing aid according to the present invention.

It is also preferable that the memory functional unit includes the charge retaining film disposed almost in parallel with a surface of the gate insulating film, i.e., the charge retaining film is disposed so that a top face of the charge retaining film in the memory functional unit is located equal in level to a top face of the gate insulating film. Specifically, as shown in FIG. 9, it is preferable that the charge retaining film 142*a* in the memory functional unit 162 includes a surface almost in parallel with the surface of the gate insulating film 114. In other words, it is preferable that the charge retaining film 142 is formed at a height equal to that of the surface of the gate insulating film 114. If the charge retaining film 142*a* almost in parallel with the surface of the gate insulating film 114 is included in the memory functional unit 162, it is possible to effectively control easiness of an inversion layer in the offset region 171 in accordance with the amount of charges accumulated in the charge retaining film 142*a*, and to eventually increase the memory effect. Furthermore, by making the charge retaining film 142*a* almost in parallel with the surface of the gate insulating film 114, a change in the memory effect can be kept relatively small and a variation in the memory effect can be controlled even if the offset amount (W1) varies. Besides, it is possible to suppress the movement of the charges to a direction of an upper portion of the charge retaining film 142*a*, and to suppress the occurrence of the change of characteristics due to the movement of charges while the memory functional unit stores and holds the information.

It is further preferable that the memory functional unit 162 includes the insulating film (e.g., a portion of the silicon oxide film 144 on the offset region 171) that isolates the charge retaining film 142*a* almost in parallel with the surface of the gate insulating film 114 from the channel formation region (or the well region). By including this insulating film in the memory functional unit 162, it is possible to suppress dissipation of the charges accumulated in the charge retaining film 142*a*, and to eventually obtain the semiconductor memory cell having good retaining characteristics.

By not only controlling a thickness of the charge retaining film 142*a* but also controlling a thickness of the insulating film (the portion of the silicon oxide film 144 on the offset region 171) below the charge retaining film 142*a* to be constant, it is possible to keep the distance from the surface of the semiconductor substrate 111 to the charges accumulated in the charge retaining film 142*a* approximately constant. Namely, the distance from the surface of the semiconductor substrate 111 to the charges accumulated in the charge retaining film 142*a* can be controlled to fall within a range from a minimum thickness of the insulating film below the charge retaining film 142*a* to a sum of a maximum thickness of the insulating film below the charge retaining film 142*a* and a maximum thickness of the charge retaining film 142*a*. It is thereby possible to approximately control a density of an electric line of force generated by the charges accumulated in the charge retaining film 142*a*, and to considerably reduce variations in the memory effect of the semiconductor memory cell.

Second Embodiment

Figure 10:
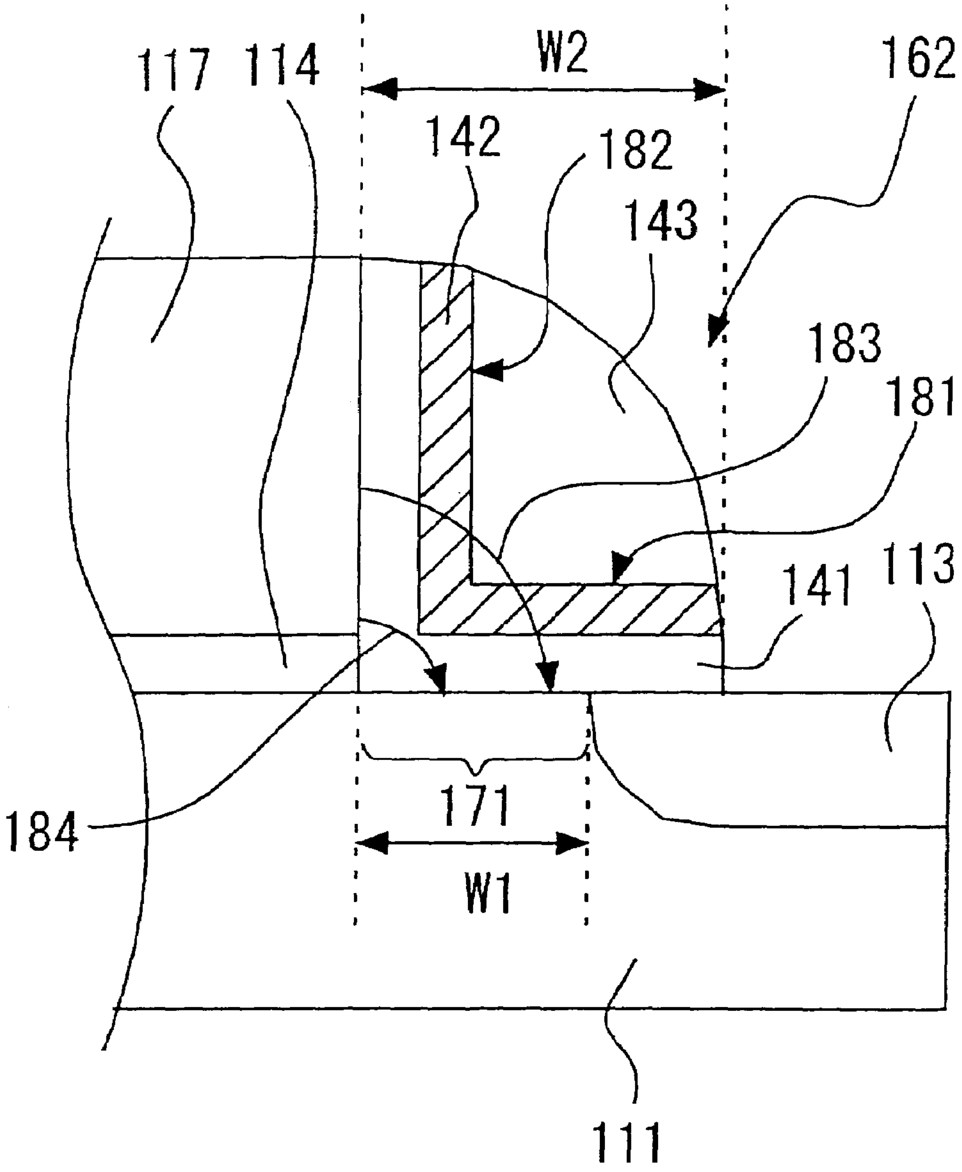
FIG. 10 is a schematic sectional view showing a main part of a semiconductor memory cell (second embodiment) used for the hearing aid according to the present invention.

In a second embodiment, the charge retaining film 142 in the memory functional unit 162 has a shape such that the charge retaining film 142 is almost uniform in thickness, disposed almost in parallel with the surface of the gate insulating film 114 (as indicated by an arrow 181), and disposed almost in parallel with a side surface of the gate electrode 117 (as indicated by an arrow 182) as shown in FIG. 10.

When a positive voltage is applied to the gate electrode 117, the electric line of force in the memory functional unit 162 passes through (portions indicated by the arrows 182 and 181 of) the silicon nitride film 142 twice as indicated by an arrow 183. When a negative voltage is applied to the gate electrode 117, the electric line of force is opposite in direction to that when the positive voltage is applied to the gate electrode 117. A dielectric constant of the silicon nitride film 142 is about six, and those of the silicon oxide films 141 and 143 are about four. Therefore, an effective dielectric constant of the memory functional unit 162 in the direction of the electric line of force indicated by the arrow 183 is higher than that of the memory functional unit in which only the charge retaining film is present as indicated by the arrow 181, thus making it possible to further decrease a potential difference between both ends of the electric line of force. In other words, a large part of the voltage applied to the gate electrode 117 is used to intensify the electric filed in the offset region 171.

The reason why charges are injected into the silicon nitride film 142 in the rewriting operation is that the generated charges are attracted by the electric field in the offset region 171. Therefore, by including the charge retaining film indicated by the arrow 182 in the memory functional unit 162, the charges injected into the memory functional unit 162 in the rewriting operation increase and the rewriting speed increases.

If the silicon oxide film 143 is replaced by the silicon nitride film, that is, the charge retaining film is not uniform in height to the surface of the gate insulating film 114, the movement of charges to the direction of the upper portion of the silicon nitride film is more conspicuous, thus deteriorating the retaining characteristics.

More preferably, the charge retaining film is made of a high dielectric such as hafnium oxide having a very high dielectric constant instead of the silicon nitride film.

It is preferable that the memory functional unit 162 further includes the insulating film (the portion of the silicon oxide film 141 on the offset region 171) that isolates the charge retaining film almost in parallel with the surface of the gate insulating film 114 from the channel formation region (or the well region). By including this insulating film in the memory functional unit 162, it is possible to suppress the dissipation of charges accumulated in the charge retaining film 142, and to further improve the retaining characteristics of the semiconductor memory cell.

Moreover, it is preferable that the memory functional unit 162 further includes the insulating film (a portion of the silicon oxide film 141 in contact with the gate electrode 117) that isolates the gate electrode 117 from the charge retaining film 142 extending in a direction almost in parallel with the side surface of the gate electrode 117). By including this insulating film in the memory functional unit 162, it is possible to prevent a change in electric characteristics due to the injection of charges from the gate electrode 117 into the charge retaining film 142, and to improve the reliability of the semiconductor memory cell.

Furthermore, similarly to the first embodiment, it is preferable to control the thickness of the insulating film below the charge retaining film 142 (the portion of the silicon oxide film 141 on the offset region 171) to be constant, and to control the thickness of the insulating film (the portion of the silicon oxide film 141 in contact with the gate electrode 117) disposed on the side surface of the gate electrode 117 to be constant. With the controlling, it is possible to approximately control the density of the electric line of force generated by the charges accumulated in the charge retaining film 142, and to prevent charge leak.

Third Embodiment

In a third embodiment, the optimization of the gate electrode, the memory functional units, and the distance between the source/drain diffusion regions will be described.

Figure 11:
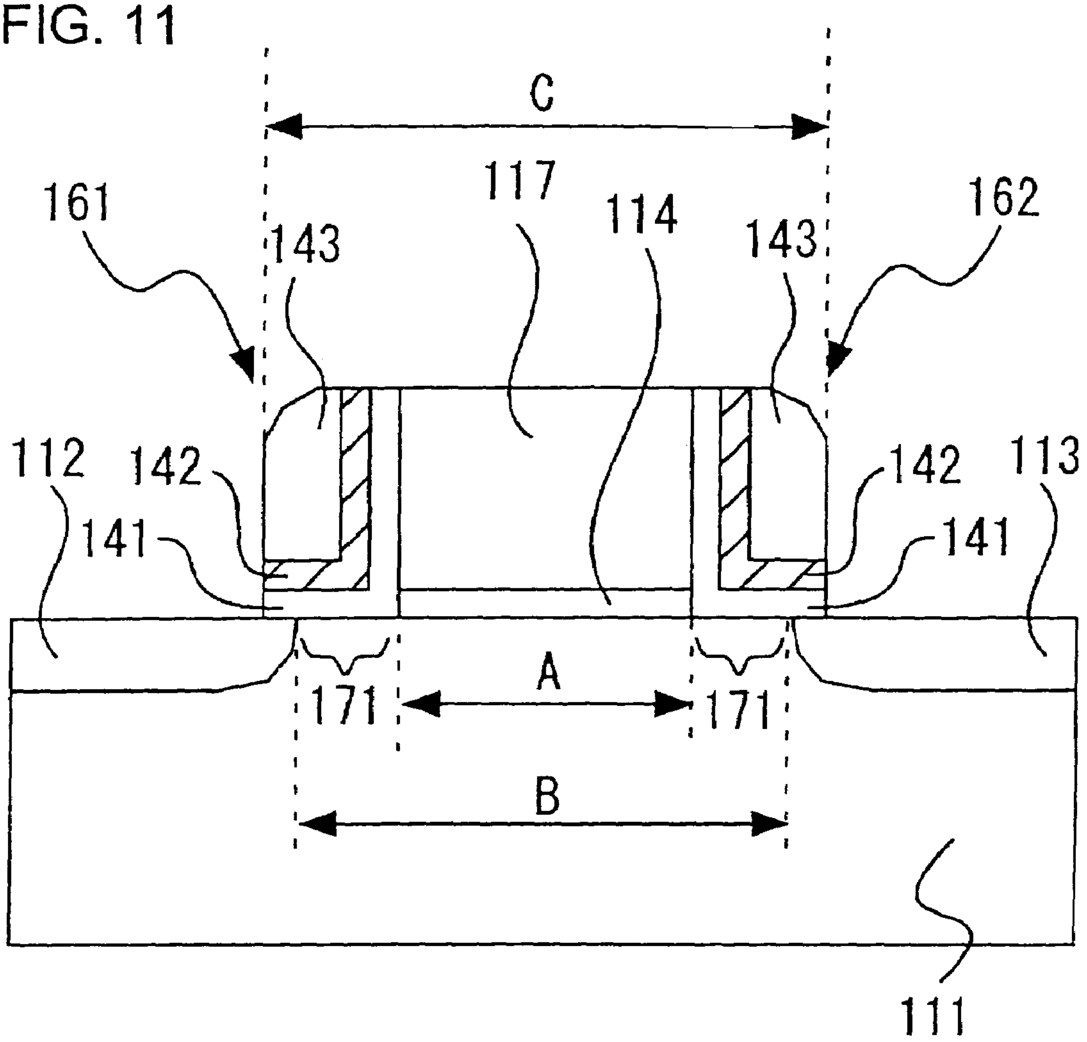
FIG. 11 is a schematic sectional view showing a main part of a semiconductor memory cell (third embodiment) used for the hearing aid according to the present invention.

As shown in FIG. 11, A denotes a length of the gate electrode 117 in a cross section in the channel length direction, B denotes a distance between the source/drain diffusion regions 112 and 113 (a channel length), and C denotes a distance from the end of one of memory functional units 161 and 162 to the end of the other memory functional unit, that is, the distance between the end (on the side away from the gate electrode 117) of the film having the function of retaining charges in one of the memory functional units 161 and 162 to the end (on the side away from the gate electrode 171) of the film having the function of retaining charges in the other memory functional unit in a cross section in the channel length direction.

It is first preferable to satisfy a relation of B<C. The offset regions 171 exist between the portion below the gate electrode 117 in the channel formation region and the diffusion regions 112 and 113, respectively. Consequently, by satisfying the relation of B<C, the easiness of inversion effectively fluctuates in the whole offset regions 171 by the charges accumulated in the memory functional units 161 and 162 (the silicon nitride films 142). Therefore, the memory effect increases and, particularly, a higher-speed reading operation is realized.

In the case where the gate electrode 117 is offset from the respective source/drain diffusion regions 112 and 113, that is, in the case where a relation of A<B is satisfied, the easiness of inversion in the offset regions 171 when a voltage is applied to the gate electrode 117 largely changes according to the amount of charges accumulated in the memory functional units 161 and 162. Therefore, the memory effect increases, and the short channel effect can be reduced. However, as long as the memory effect appears, the offset regions 171 do not always exist. Even if the offset regions 171 do not exist, the memory effect can be exhibited in the memory functional units 161 and 162 (the silicon nitride films 142) as long as the impurity concentrations of the source/drain diffusion regions 112 and 113 are sufficiently low.

Therefore, it is most preferable to satisfy a relation of A>B<C.

Fourth Embodiment

Figure 12:
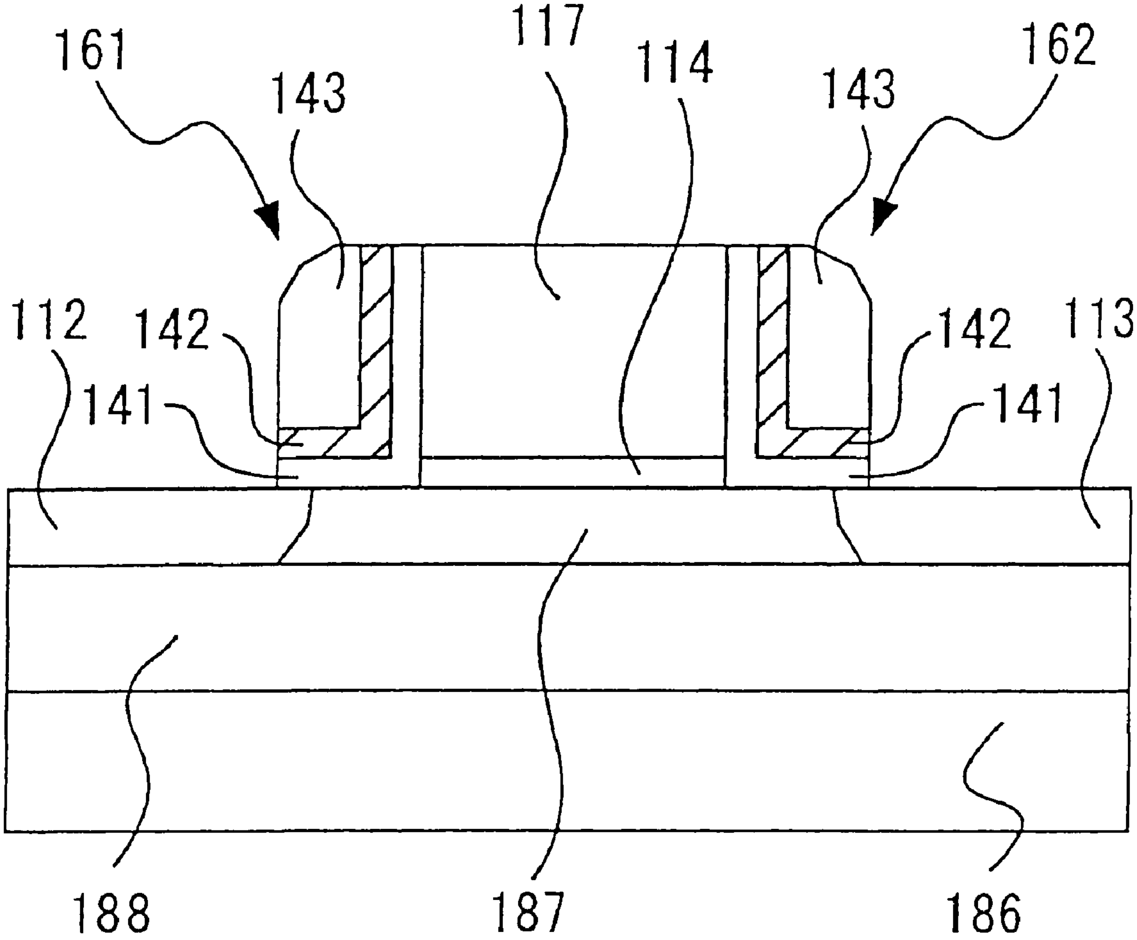
FIG. 12 is a schematic sectional view showing a main part of a semiconductor memory cell (fourth embodiment) used for the hearing aid according to the present invention.

A semiconductor memory cell in a fourth embodiment is substantially similar in configuration to the semiconductor memory cell in the first embodiment except that the SOI substrate is used as the semiconductor substrate as shown in FIG. 12.

In the semiconductor memory cell, a buried oxide film 188 is formed on a semiconductor substrate 186, and an SOI layer is formed on the buried oxide film 188. In the SOI layer, the source/drain diffusion regions 112 and 113 are formed and a region other than the source/drain diffusion regions 112 and 113 is a body region 187.

This semiconductor memory cell can exhibit the same actions and effects as those of the semiconductor memory cell in the third embodiment. Further, a junction capacitance between each of the source/drain diffusion regions 112 and 113 and the body region 187 can be remarkably reduced, so that higher-speed operation and lower power consumption of the semiconductor memory cell can be achieved.

Fifth Embodiment

Figure 13:
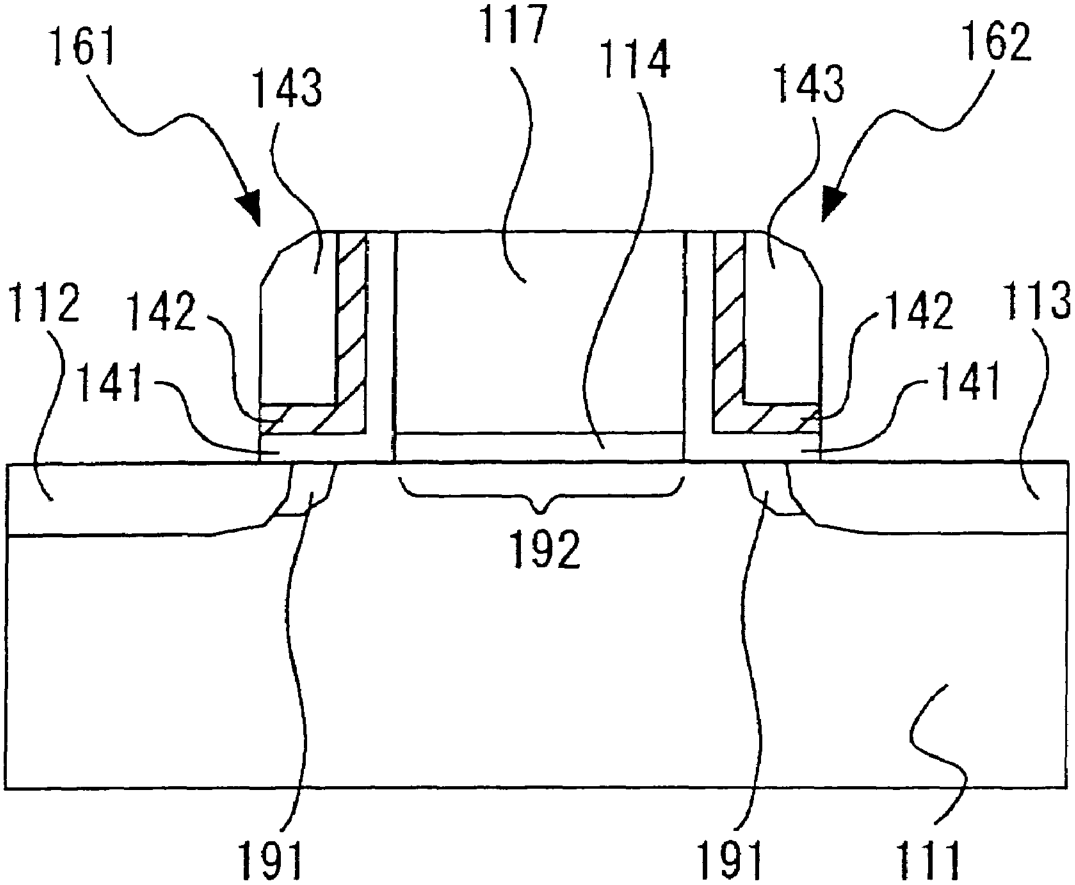
FIG. 13 is a schematic sectional view showing a main part of a semiconductor memory cell (fifth embodiment) used for the hearing aid according to the present invention.

A semiconductor memory cell in a fifth embodiment is, as shown in FIG. 13, substantially similar in configuration to the semiconductor memory cell in the first embodiment except that P-type high-concentration regions 191 are additionally provided adjacent to channel sides of the N-type source/drain diffusion regions 112 and 113, respectively.

Specifically, the concentration of a P-type impurity (for example, boron) in the P-type high-concentration regions 191 is higher than that of a P-type impurity in a region 192. It is appropriate that the P-type impurity concentration of the P-type high-concentration regions 191 is, for example, about $5\times10^{17}$ to $1\times10^{19}$ $cm^{31\ 3}$. The P-type impurity concentration of the region 192 can be set at, for example, $5\times10^{16}$ to $1\times10^{18}$ $cm^{-3}$.

By thus providing the P-type high-concentration regions 191, the junction between each of the source/drain diffusion regions 112 and 113 and the semiconductor substrate 111 becomes sharp immediately below the memory functional units 161 and 162. Consequently, hot carriers are easily generated in the writing and erasing operations, the voltage of the writing and erasing operations can be decreased or the writing operation and the erasing operation can be performed at high speeds. Moreover, since the impurity concentration of the region 192 is relatively low, a threshold when the memory is in the erasing state is low, and the drain current is high. Consequently, the reading speed is improved. Therefore, the semiconductor memory cell at a low rewriting voltage or a high rewriting speed, and at a high reading speed can be obtained.

In FIG. 13, by providing the P-type high-concentration regions 191 in the vicinity of the source/drain regions and below the memory functional units 161 and 162 (that is, not immediately below the gate electrode 117), the threshold of the whole transistor remarkably increases. The degree of increase is much higher than that in the case where the P-type high-concentration regions 191 are immediately below the gate electrode 117. In the case where write charges (electrons when the transistor is of the N-channel type) are accumulated in the memory functional unit, this difference becomes larger.

On the other hand, in the case where sufficient erasing charges (positive holes when the transistor is of the N-channel type) are accumulated in the memory functional unit, the threshold of the whole transistor decreases to a threshold determined by the impurity concentration of the channel formation region (region 192) below the gate electrode 117. That is, the threshold in the erasing operation does not depend on the impurity concentrations of the P-type high-concentration region 191 whereas the threshold in the writing operation is largely influenced by the impurity concentrations of the P-type high-concentration region 191. Therefore, by disposing the P-type high-concentration regions 191 below the memory functional units 161 and 162 and in the vicinity of the source/drain diffusion regions 112 and 113, respectively, only the threshold in the writing operation largely fluctuates, and the memory effect (the difference between the threshold in the writing operation and that in the erasing operation) can be remarkably increased.

Sixth Embodiment

Figure 14:
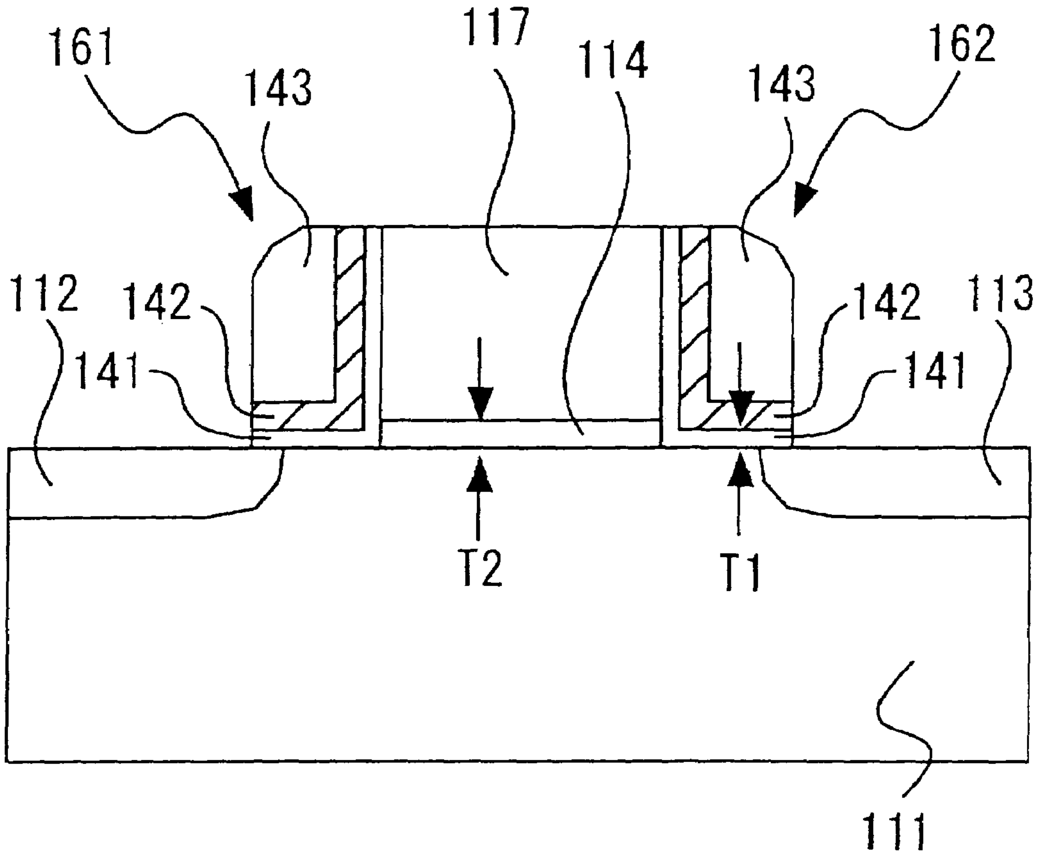
FIG. 14 is a schematic sectional view showing a main part of a semiconductor memory cell (sixth embodiment) used for the hearing aid according to the present invention.

A semiconductor memory cell in a sixth embodiment is substantially similar in configuration to that of the first embodiment except that, as shown in FIG. 14, a thickness (T1) of the insulating film isolating the charge retaining film (silicon nitride film 142) from the channel formation region or well region is smaller than a thickness (T2) of the gate insulating film 114.

The thickness T2 of the gate insulating film 114 has a lower limit from a demand of withstand voltage at the time of the memory rewriting operation. However, the thickness T1 of the insulating film can be made smaller than T2 irrespective of the demand of withstand voltage.

The flexibility of designing with respect to T1 is high in the semiconductor memory cell in this embodiment for the following reason. In this semiconductor memory cell, the insulating film for isolating the charge retaining film 142 from the channel formation region or well region is not sandwiched between the gate electrode 117 and the channel formation region or well region. Namely, the semiconductor memory cell does not have such configuration that the insulating film that isolates the charge retaining film 142 from the channel formation region or well region extends below the gate electrode 117. Consequently, on the insulating film isolating the charge retaining film 142 from the channel formation region or well region, a high electric field acting between the gate electrode 117 and the channel formation region or well region does not directly act, but a relatively low electric field spreading from the gate electrode 117 in a lateral direction acts. Therefore, irrespective of the demand of withstand voltage to the gate insulating film, T1 can be set smaller than T2. In the EEPROM represented by a flash memory, by contrast, an insulating film that isolates a floating gate from the channel formation region or well region is sandwiched between the gate electrode (control gate) and the channel formation region or well region. Therefore, the high electric field from the gate electrode directly acts on the insulating film. As a result, in the EEPROM, the thickness of the insulating film that isolates the floating gate from the channel formation region or well region is restricted, and the optimization of the functions of the semiconductor memory cell is hampered.

As is obvious from the above, a factor that the insulating film which isolates the charge retaining film from the channel formation region or well region in the semiconductor memory cell is not sandwiched between the gate electrode and the channel formation region or the well region in this embodiment is an essential reason for increasing the flexibility of designing with respect to T1.

By making T1 thinner, the injection of charges into the memory functional unit becomes easier, the voltage of the writing operation and that of the erasing operation are lowered or the writing operation and erasing operation can be performed at high speeds. Since the amount of charges induced in the channel formation region or well region when charges are accumulated in the silicon nitride film 142 increases, the memory effect can be increased.

The electric lines of force in the memory functional unit 161 or 162 include a short one which does not pass through the silicon nitride film 142 as indicated by the arrow 184 in FIG. 10. On such a relatively short electric line of force, electric field intensity is relatively high, so that the electric field along this electric line of force plays a big role in the rewriting operation. By reducing T1, the silicon nitride film 142 is positioned downward in FIG. 10, and the electric line of force indicated by the arrow 183 passes through the silicon nitride film 142. Consequently, the effective dielectric constant in the memory functional unit along the electric line 184 of force increases, and the potential difference between the both ends of the electric line of force can be further decreased. Therefore, a large part of the voltage applied to the gate electrode 117 is used to intensify the electric field in the offset region 171, and the writing operation and the erasing operation are performed at faster speeds.

By satisfying the relation of T1<T2, as obvious from the above, it is possible to decrease the voltage in the writing operation and the erasing operation, to make the writing operation and the erasing operation higher, and to further increase the memory effect, without lowering the withstand voltage performance of the memory The thickness T1 of the insulating film is preferably 0.8 nm or more which is a limit at which uniformity in the manufacturing process and film quality can be maintained at constant levels and at which the retaining characteristics is not extremely deteriorated.

In particular, in the case of a liquid crystal driver LSI requiring a high withstand voltage in a design rule, to drive a liquid crystal panel TFT, a voltage of 15 to 18 V at the maximum is required, so that the gate oxide film cannot be thinned. In the case of mounting a nonvolatile memory of the present invention for image adjustment on the liquid crystal driver LSI, in the semiconductor memory cell of the present invention, the thickness of the insulating film that isolates the charge retaining film (silicon nitride film 142) from the channel formation region or well region can be designed optimally independently of the thickness of the gate insulating film 114. For example, the thicknesses can be individually set as T1=20 nm and T2=10 nm for a memory cell having a gate electrode length (word line width) of 250 nm, so that a memory cell having high writing efficiency can be realized (the reason why the short channel effect does not occur even if T1 is larger than the thickness of a normal logic transistor is that the source and drain diffusion regions 112 and 113 are offset from the gate electrode 117).

Seventh Embodiment

Figure 15:
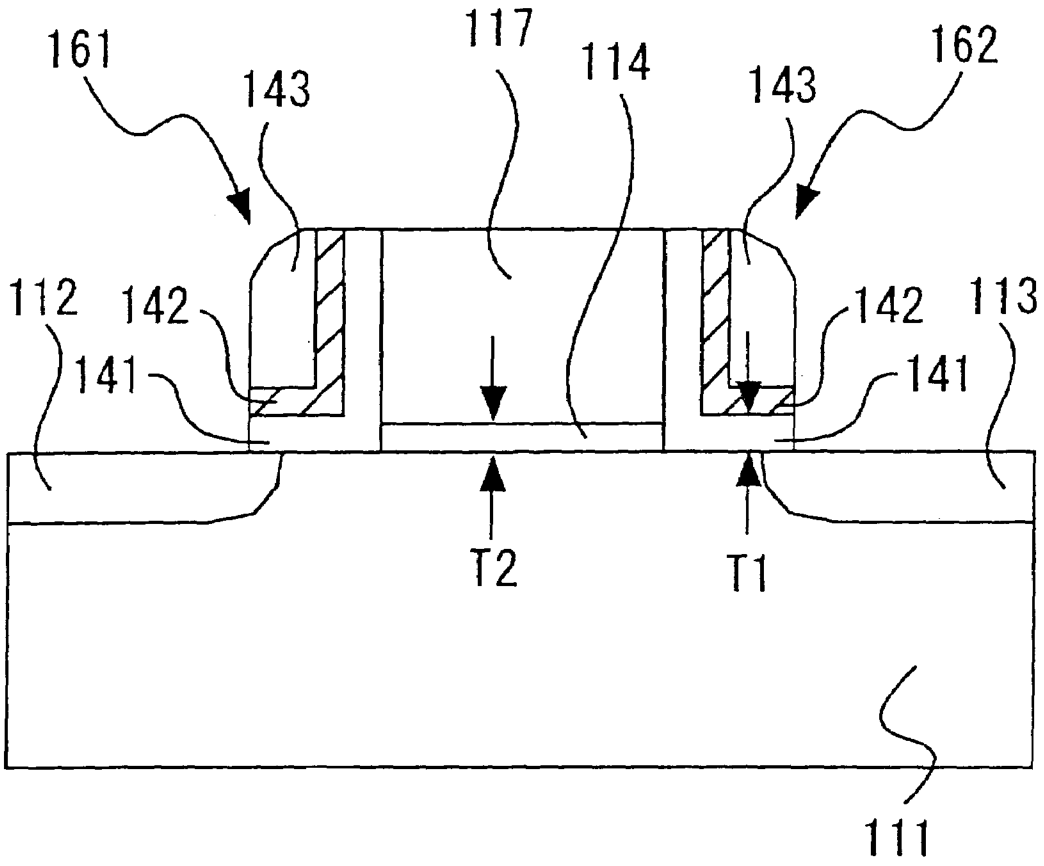
FIG. 15 is a schematic sectional view showing a main part of a semiconductor memory cell (seventh embodiment) used for the hearing aid according to the present invention.

A semiconductor memory cell in a seventh embodiment is substantially similar in configuration to that in the first embodiment except that, as shown in FIG. 15, the thickness (T1) of the insulating film that isolates the charge retaining film (silicon nitride film 142) from the channel formation region or well region is larger than the thickness (T2) of the gate insulating film 114.

The thickness T2 of the gate insulating film 114 has an upper limit due to a demand of preventing the short channel effect of a cell. However, the thickness T1 of the insulating film can be made larger than T2 irrespective of the demand of preventing the short channel effect. Specifically, when reduction in scaling progresses (when reduction in the thickness of the gate insulating film 114 progresses), the thickness of the insulating film that isolates the charge retaining film (silicon nitride film 142) from the channel formation region or well region can be designed optimally independent of the thickness T2 of the gate insulating film 114. Thus, the semiconductor memory cell exhibits an effect that the memory functional units 161 and 162 do not disturb scaling.

The reason why the flexibility of designing T1 is high in the semiconductor memory cell in this embodiment are that, as described already, the insulating film that isolates the charge retaining film 142 from the channel formation region or well region is not sandwiched between the gate electrode 117 and the channel formation region or well region. Consequently, irrespective of the demand of preventing the short channel effect for the gate insulating film, T1 can be made thicker than T2.

By making T1 thicker, the dissipation of the charges accumulated in the memory functional units 161 and 162 can be prevented and the retaining characteristics of the semiconductor memory cell can be improved.

Therefore, by setting T1>T2, the retaining characteristics can be improved without deteriorating the short channel effect of the memory.

The thickness T1 of the insulating film is, preferably, 20 nm or less in consideration of a decrease in the rewriting speed.

In particular, in the conventional nonvolatile memory typified by the flash memory, a selection gate electrode serves as a write erase gate electrode, and a gate insulating film (including the floating gate) corresponding to the write erase gate electrode also serves as a charge accumulating film. Since a demand for size reduction (thinning of a film is indispensable to suppress the short channel effect) and a demand for assuring reliability (to suppress leak of retained charges, the thickness of the insulating film isolating the floating gate from the channel formation region or well region cannot be reduced to about 7 nm or less) are contradictory to each other, it is difficult to reduce the size. Actually, according to the ITRS (International Technology Roadmap for Semiconductors), there is no prospect of reduction in a physical gate length of about 0.2 micron or less. In the semiconductor memory cell of the present invention, since the thicknesses T1 and T2 can be individually designed as described above, the size reduction is possible.

For example, for the memory cell having a gate electrode length (word line width) of 45 nm, T2=4 nm and T1=7 nm are individually set, and the semiconductor memory cell in which the short channel effect is not produced can be realized. The reason the short channel effect is not produced even when T2 is set to be thicker than the thickness of the normal logic transistor is that the source/drain diffusion regions 112 and 113 are offset from the gate electrode 117. Since the source/drain diffusion regions are offset from the gate electrode in the semiconductor memory cell of the present invention. Therefore, as compared with the normal logic transistor, the reduction in size can be further facilitated.

In short, since the electrode for assisting in writing and erasing does not exist in the upper part of the memory functional unit 161 or 162, a high electric field acting between the electrode for assisting in writing and erasing and the channel formation region or well region does not directly act on the insulating film that isolates the charge retaining film 142 from the channel formation region or well region, but only a relatively low electric field which spreads in the lateral direction from the gate electrode 117 acts thereon. Consequently, the memory cell having a gate length which is reduced to be equal to or less than the gate length of the logic transistor in the same process generation can be realized.

Eighth Embodiment

In an eighth embodiment, a method of operating the semiconductor memory cell will be described.

Figure 16:
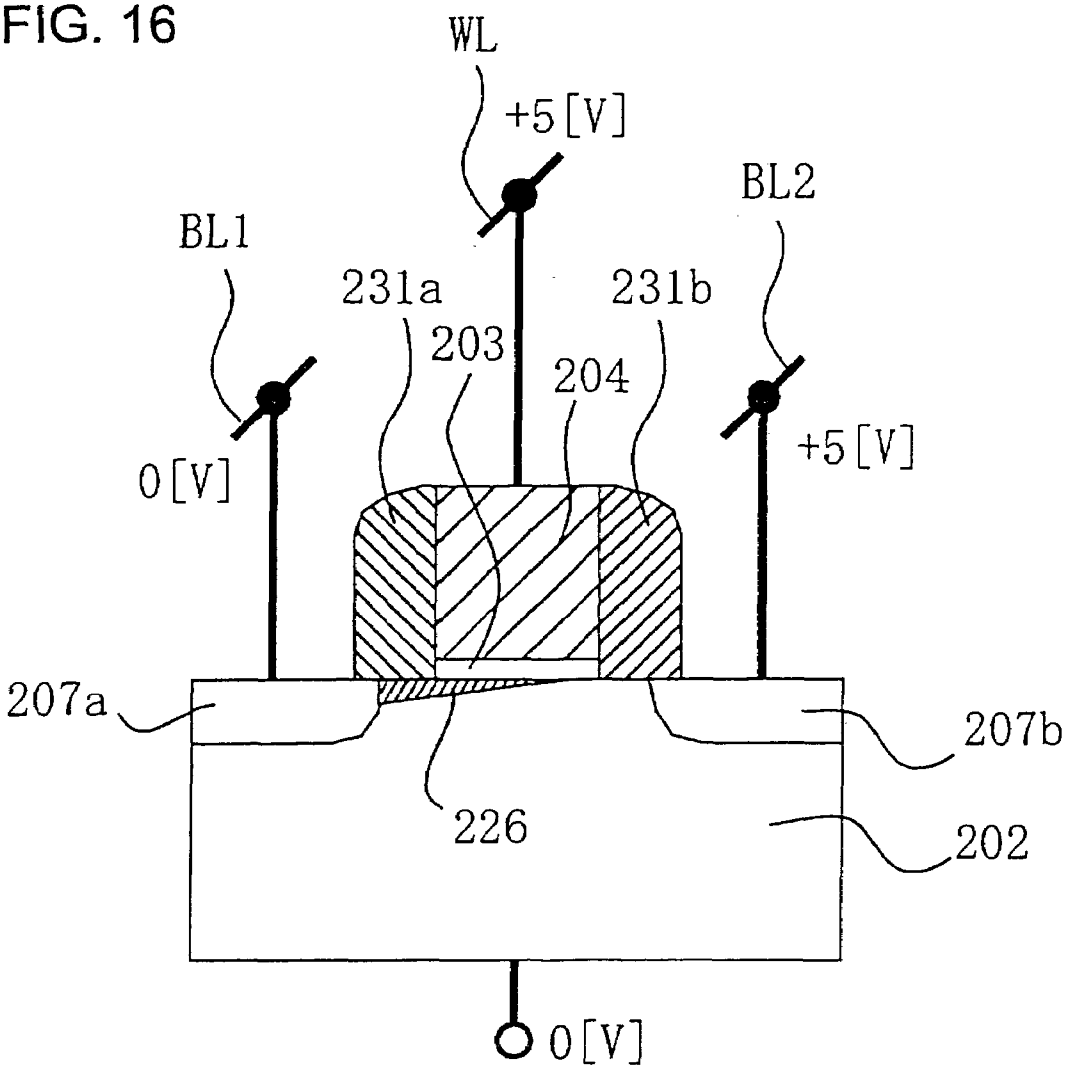
FIG. 16 is a diagram for describing a writing operation of the semiconductor memory cell used for the hearing aid according to the present invention.
Figure 17:
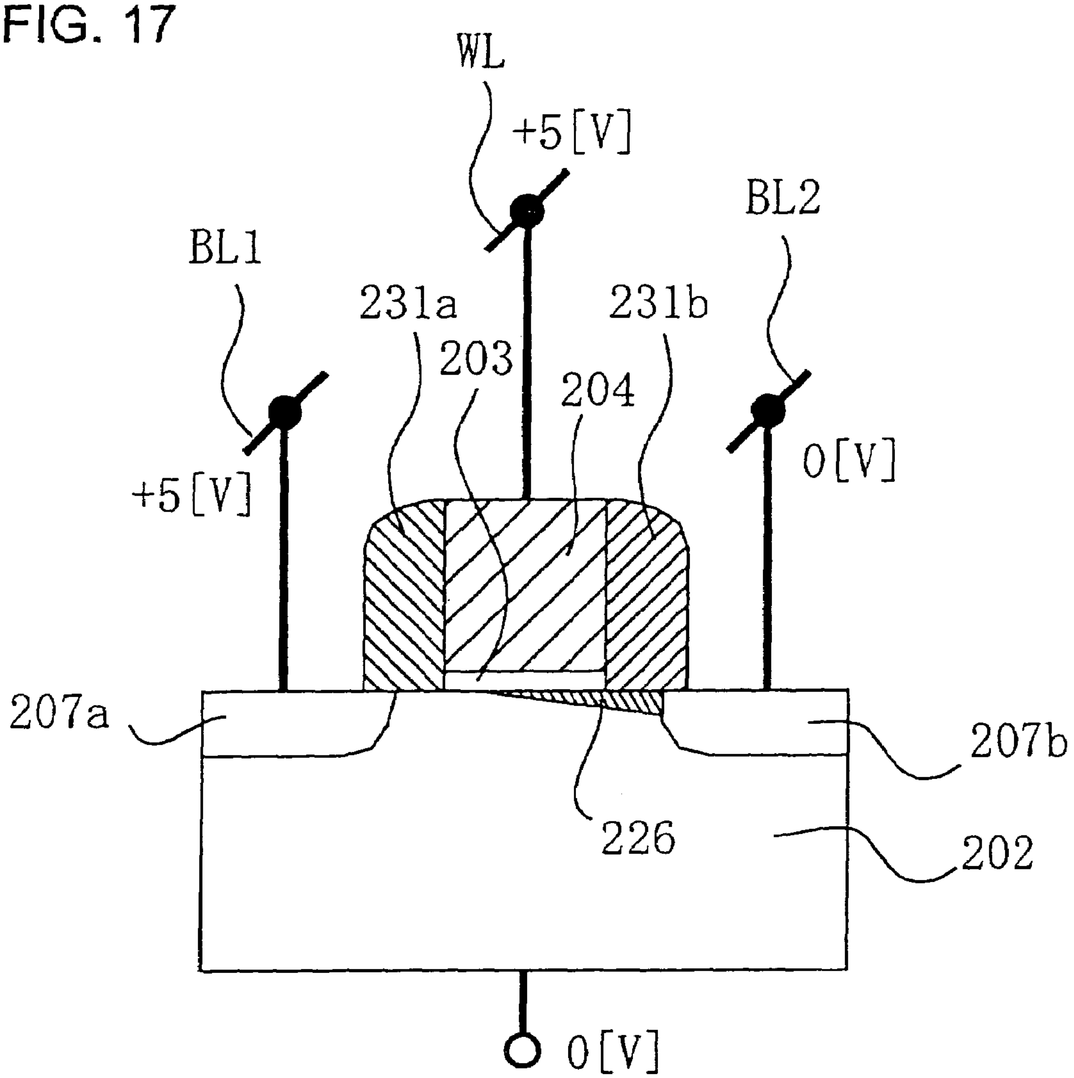
FIG. 17 is a diagram for describing a writing operation of the semiconductor memory cell used for the hearing aid according to the present invention.

The principle of the writing operation of the semiconductor memory cell will first be described with reference to FIGS. 16 and 17. In FIGS. 16 and 17, 203 denotes a gate insulating film, 204 denotes a gate electrode, WL denotes a word line, BL1 denotes a first bit line, and BL2 denotes a second bit line. In this embodiment, the case where each of memory functional units 231*a* and 231*b* has the function of retaining charges will be described.

It is assumed herein that write (writing) means to inject (injecting) electrons into the memory functional units 231*a* and 231*b* if the semiconductor memory cell is of the N channel type. Hereinafter, the embodiment will be described assuming that the semiconductor memory cell is of the N channel type.

In order to inject electrons (write information) into the second memory functional unit 231*b*, a first source/drain diffusion region 207*a* (of the N conductive type) is set as the source electrode and a second source/drain diffusion region 207*b* (of the N conductive type) is set as the drain electrode as shown in FIG. 16. For example, 0 V is applied to a first source/drain diffusion region 207*a* and a P-type well region 202, +5 V is applied to a second source/drain diffusion region 207*b*, and +5 V is applied to the gate electrode 204.

Under such voltage conditions, an inversion layer 226 extends from the first source/drain diffusion region 207*a* (source electrode) but does not reach the second source/drain diffusion region 207*b* (drain electrode), and the pinch-off point occurs. The electrons are accelerated from the pinch-off point to the second source/drain diffusion region 207*b* (drain electrode) by the high electric field, and become so-called hot electrons (high-energy conduction electrons). By injection of the hot electrons into the second memory functional unit 231*b*, writing is performed. Since hot electrons are not generated in the vicinity of the first memory functional unit 231*a*, writing is not performed in the first memory functional unit 231*a*.

Thus, it is possible to inject electrons into the second memory functional unit 231*b* and to thereby perform writing.

On the other hand, in order to inject electrons (write information) into the first memory functional unit 231*a*, as shown in FIG. 17, the second source/drain diffusion region 207*b* is set as the source electrode, and the first source/drain diffusion region 207*a* is set as the drain electrode. For example, 0 V is applied to the second source/drain diffusion region 207*b* and the P-type well region 202, +5 V is applied to the first source/drain diffusion region 207*a*, and +5 V is applied to the gate electrode 204. By interchanging the source/drain regions so as to be different from the case of injecting electrons into the second memory functional unit 231*b*, electrons are injected into the first memory functional unit 231*a* and writing can be performed in the first memory functional unit 231*a*.

The principle of the erasing operation of the semiconductor memory cell will next be described with reference to FIGS. 18 and 19.

Figure 18:
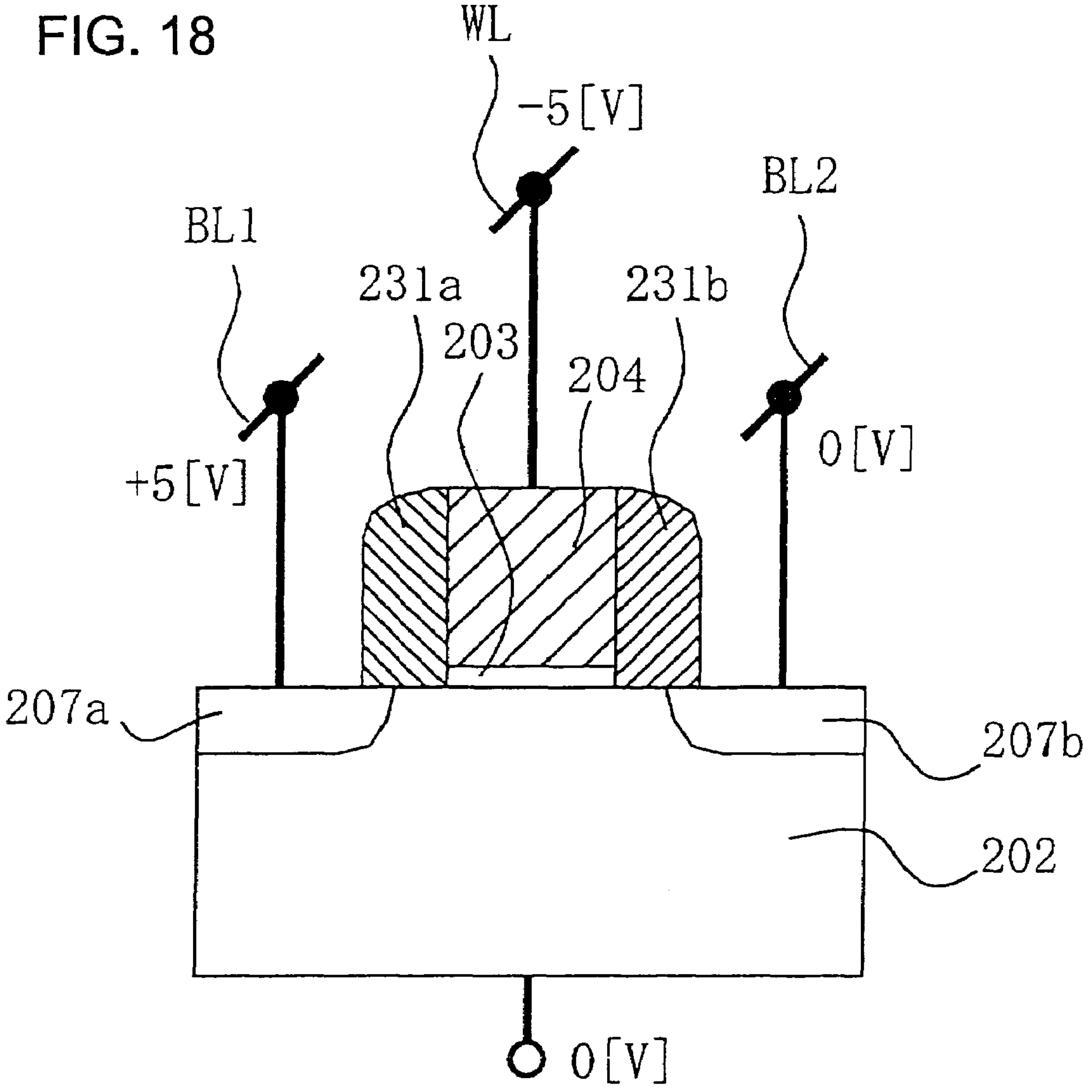
FIG. 18 is a diagram for describing a first erasing operation of the semiconductor memory cell used for the hearing aid according to the present invention.

In a first method of erasing information stored in the first memory functional unit 231*a*, by applying a positive voltage (for example, +5 V) to the first source/drain diffusion region 207*a* and applying 0 V to the P-type well region 202 as shown in FIG. 18, a PN junction between the first source/drain diffusion region 207*a* and the P-type well region 202 is reverse-biased and, further, a negative voltage (for example, −5 V) is applied to the gate electrode 204. At this time, in the vicinity of the gate electrode 204 in the PN junction, due to the influence of the gate electrode 204 to which the negative voltage is applied, particularly, a gradient of potential is sharp. Consequently, hot holes (high-energy positive holes) are generated on the side of the P-type well region 202 of the PN junction by interband tunneling. The hot holes are attracted toward the gate electrode 104 having a negative potential. As a result, the holes are injected into the first memory functional unit 231*a*. In such a manner, the information in the first memory functional unit 231*a* is erased. At this time, to the second source/drain diffusion region 207*b*, it is sufficient to apply 0 V.

In the case of erasing the information stored in the second memory functional unit 231*b*, the above-described operation is performed while interchanging the potential of the first source/drain diffusion region 207*a* and that of the second source/drain diffusion region 207*b*.

Figure 19:
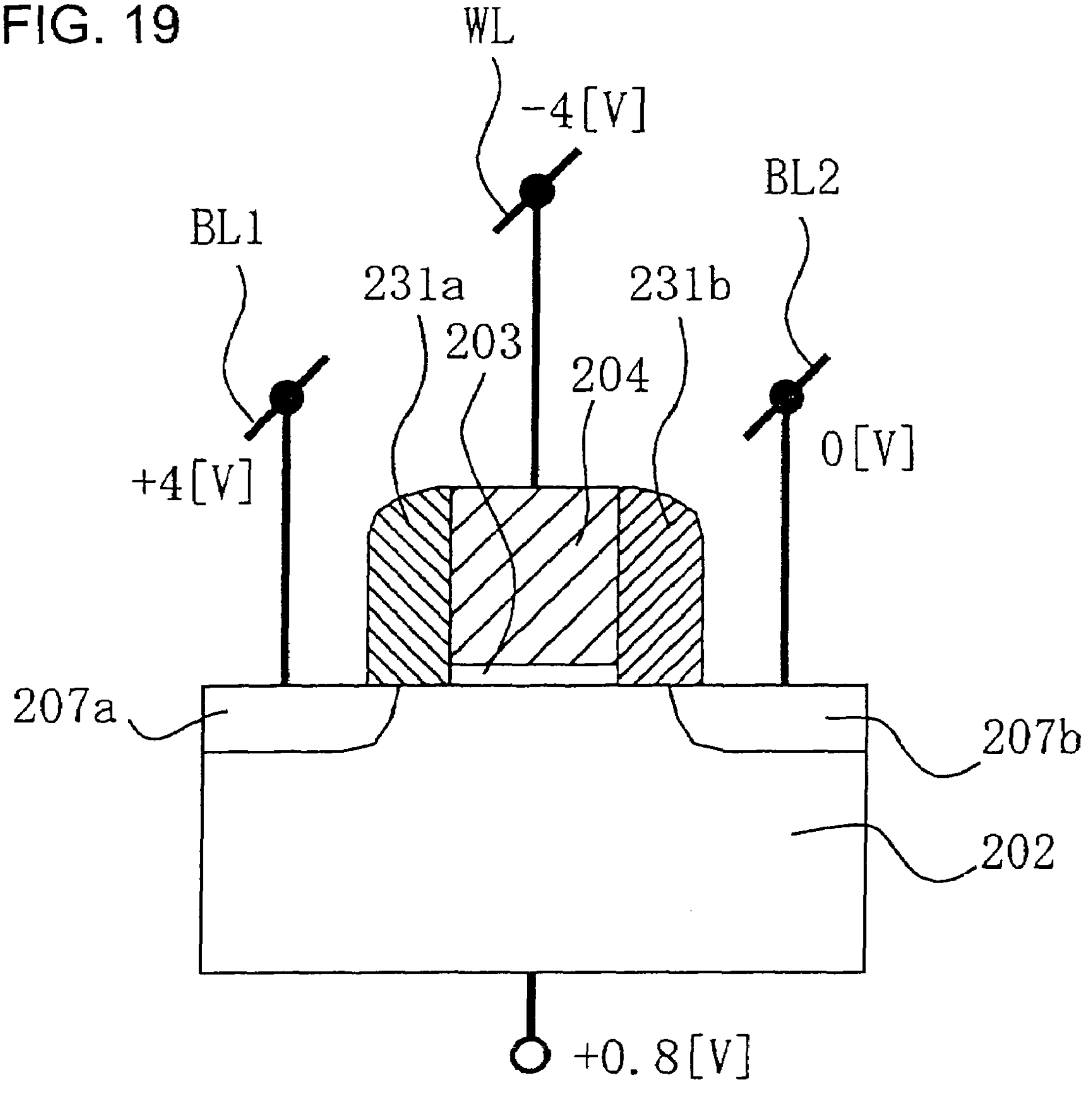
FIG. 19 is a diagram for describing a second erasing operation of the semiconductor memory cell used for the hearing aid according to the present invention.

In a second method of erasing the information stored in the first memory functional unit 231*a*, as shown in FIG. 19, a positive voltage (for example, +4 V) is applied to the first source/drain diffusion region 207*a*, 0 V is applied to the second source/drain diffusion region 207*b*, a negative voltage (for example, −4 V) is applied to the gate electrode 204, and a positive voltage (for example, +0.8 V) is applied to the P-type well region 202. At this time, a forward voltage is applied between the P-type well region 202 and the second source/drain diffusion region 207*b*, and electrons are injected to the P-type well region 202. The injected electrons are diffused to the PN junction between the P-type well region 202 and the first source/drain diffusion region 207*a*, where the electrons are accelerated by the strong electric field, thereby becoming hot electrons. By the hot electrons, an electron-hole pair is generated in the PN junction.

Specifically, by applying the forward voltage between the P-type well region 202 and the second source/drain diffusion region 207*b*, the electrons injected in the P-type well region 202 turn a trigger, and hot holes are generated in the PN junction positioned on the opposite side. The hot holes generated in the PN junction are attracted toward the gate electrode 204 having the negative potential. As a result, positive holes are injected into the first memory functional unit 231*a*.

According to the second method, even if only the voltage insufficient to generate hot holes by interband tunneling is applied to the PN junction between the P-type well region 202 and the first source/drain diffusion region 207*a*, the electrons injected from the second source/drain diffusion region 207*b* turn a trigger to generate an electron-positive hole pair in the PN junction, thereby enabling hot holes to be generated. Therefore, the voltage in the erasing operation can be decreased. Particularly if the source/drain diffusion regions 207*a* and 207*b* are offset from the gate electrode 104, respectively, the effect that the gradient of potential in the PN junction becomes sharp by the gate electrode 207 to which the negative potential is applied is low. Consequently, although it is difficult to generate hot holes by interband tunneling, the second method can overcome the disadvantage and enables realizing the erasing operation at low voltage.

In the case of erasing the information stored in the first memory functional unit 231*a*, +5 V has to be applied to the first source/drain diffusion region 207*a* according to the first erasing method whereas it suffices to apply +4 V thereto according to the second erasing method. As can be seen, according to the second method, the voltage at the time of erasing can be decreased, so that power consumption can be reduced and the deterioration of the semiconductor memory cell due to the hot carriers can be suppressed.

Any of the erasing methods characteristically makes it difficult to cause over-erasure to occur in the semiconductor memory cell. The "over-erasure" herein means a phenomenon that as the amount of positive holes accumulated in the memory functional unit increases, the threshold decreases without saturation. The over-erasure is a big issue in the EEPROM typified by the flash memory. Particularly if the threshold is negative, critical malfunctioning that selection of a memory cell is impossible occurs. In the semiconductor memory cell of the present invention, by contrast, even if a large amount of positive holes are accumulated in the memory functional unit, only the electrons are induced below the memory functional unit but an influence is hardly exerted to the potential in the channel formation region below the gate insulating film. Since the threshold at the time of erasing is determined by the potential below the gate insulating film, occurrence of over-erasure is suppressed.

The principle of the reading operation of the semiconductor memory cell will be described with reference to FIG. 20.

Figure 20:
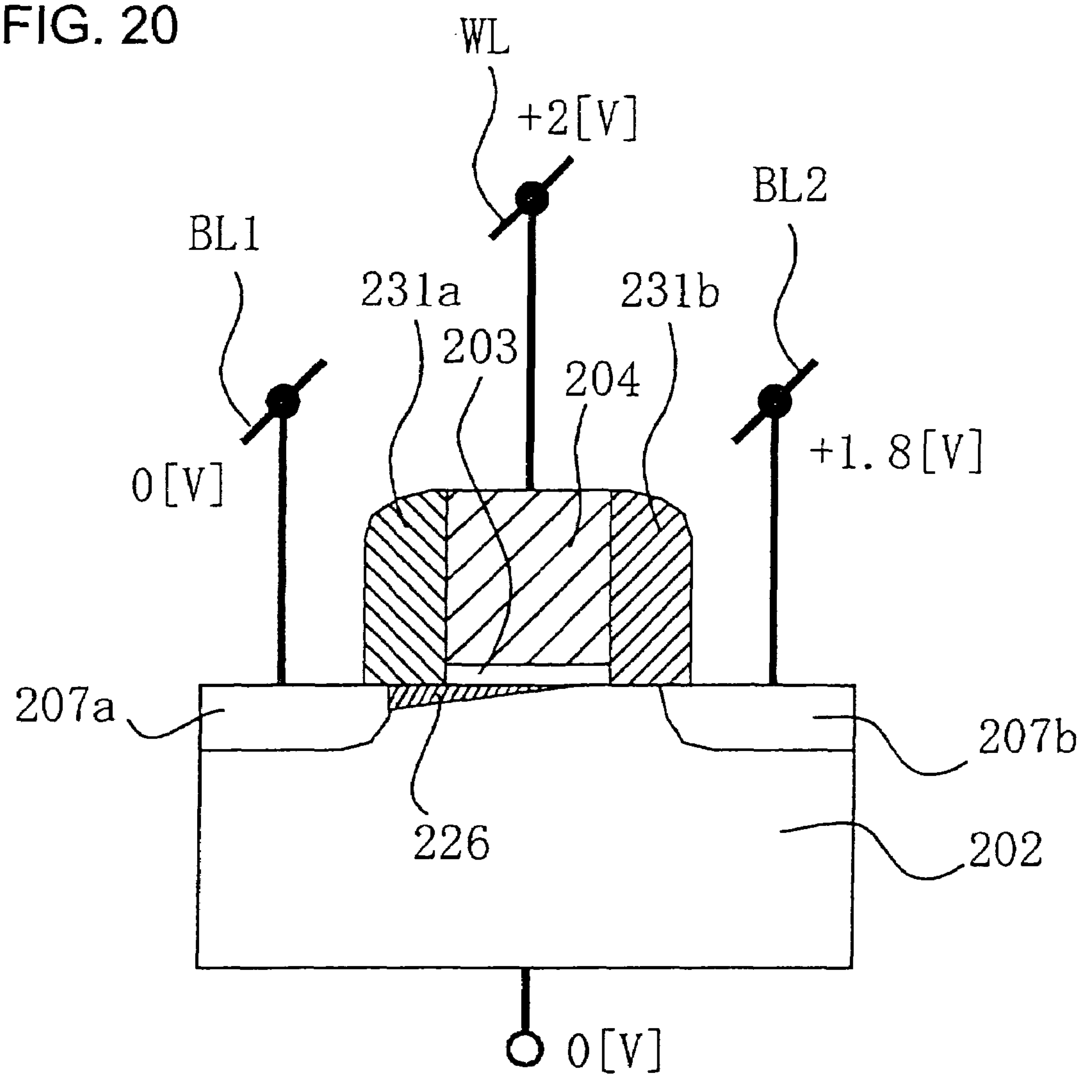
FIG. 20 is a diagram for describing a reading operation of the semiconductor memory cell used for the hearing aid according to the present invention.

In the case of reading the information stored in the first memory functional unit 231*a*, as shown in FIG. 20, the first source/drain diffusion region 207*a* is set as the source electrode, the second source/drain diffusion region 207*b* is set as the drain electrode, and the transistor is allowed to operate in a saturated region.

For example, 0 V is applied to the first source/drain diffusion region 207*a* and the P-type well region 202, +1.8 V is applied to the second source/drain diffusion region 207*b*, and +2 V is applied to the gate electrode 204. If the electrons are not accumulated in the first memory functional unit 231*a* at this time, a drain current is apt to flow. On the other hand, if the electrons are accumulated in the first memory functional unit 231*a*, the inversion layer is not easily formed in the vicinity of the first memory functional unit 231*a*, so that the drain current is not apt to flow. Therefore, by detecting the drain current, the information stored in the first memory functional unit 231*a* can be read. The presence/absence of the charges accumulated in the second memory functional unit 231*b* does not exert an influence on the drain current since the pinch-off point occurs in an area in the vicinity of the drain.

If the information stored in the second memory functional unit 231*b* is read, the second source/drain diffusion region 207*b* is set as the source electrode, the first diffusion region 207*a* is set as the drain electrode, and the transistor is operated in the saturated region. It is sufficient to apply, for example, 0V to the second source/drain diffusion region 207*b* and the P-type well region 202, +1.8 V to the first source/drain diffusion region 207*a*, and +2 V to the gate electrode 204. By interchanging the source/drain regions of the case of reading information stored in the first memory functional unit 131*a*, information stored in the second memory functional unit 231*b* can be read.

If the channel formation region which is not covered with the gate electrode 204 remains, the inversion layer 226 is dissipated or formed according to the presence/absence of excessive charges in the memory functional units 231_a_ and 231_b_ in the channel formation region which is not covered with the gate electrode 204. As a result, a large hysteresis (a change in threshold) is obtained. However, when the offset regions are too wide, the drain current largely decreases and the reading speed is greatly reduced. Therefore, it is preferable to determine the widths of the offset region so as to obtain a sufficiently large hysteresis and a sufficiently high reading speed.

If the source/drain diffusion regions 207_a_ and 207_b_ reach the ends of the gate electrode 204, respectively, that is, if the source/drain diffusion regions 207_a_ and 207_b_ are overlapped with the gate electrode 204, the threshold of the transistor hardly changes with the writing operation. However, a parasitic resistance at each source/drain end largely changes, and the drain current largely decreases (by as much as one digit or more). Therefore, reading can be performed by detecting the drain current, and the function as a memory can be obtained. If a larger memory hysteresis effect is necessary, it is preferable that the source/drain diffusion regions 207_a_ and 207_b_ are not overlapped with the gate electrode 204.

By these operating methods, two bits can be selectively written and erased per one transistor. By connecting the word line WL to the gate electrode 204 in the semiconductor memory cell, connecting the first bit line BL1 to the first source/drain diffusion region 207_a_, connecting the second bit line BL2 to the second source/drain diffusion region 207_b_, and arranging semiconductor memory cells, a memory cell array can be constructed.

In the above-described operating methods, by interchanging the source electrode and the drain electrode, the writing and erasing of two bits per one transistor are performed. Alternatively, by fixing the source electrode and the drain electrode, the transistor may operate as a one-bit memory. In this case, a common fixed voltage can be applied to one of the source/drain diffusion regions, so that the number of bit lines connected to the source/drain diffusion regions can be reduced to half.

As is obvious from the above description, in the semiconductor memory cell of the present invention, the memory functional units are formed independently of the gate insulating film, and formed on the both sides of the gate electrode, respectively. Therefore, the semiconductor memory cell can perform the two-bit operation. Since each memory functional unit is isolated by the gate electrode, interference at the time of rewriting can be effectively suppressed. Further, since the gate insulating film is isolated from each memory functional unit, the gate insulating film can be formed thin and the short channel effect can be suppressed. This can, therefore, facilitate the reduction in size of the semiconductor memory cell.

Ninth Embodiment

In a ninth embodiment, a change in electric characteristics at the time of rewriting information stored in the semiconductor memory cell will be described.

Figure 21:
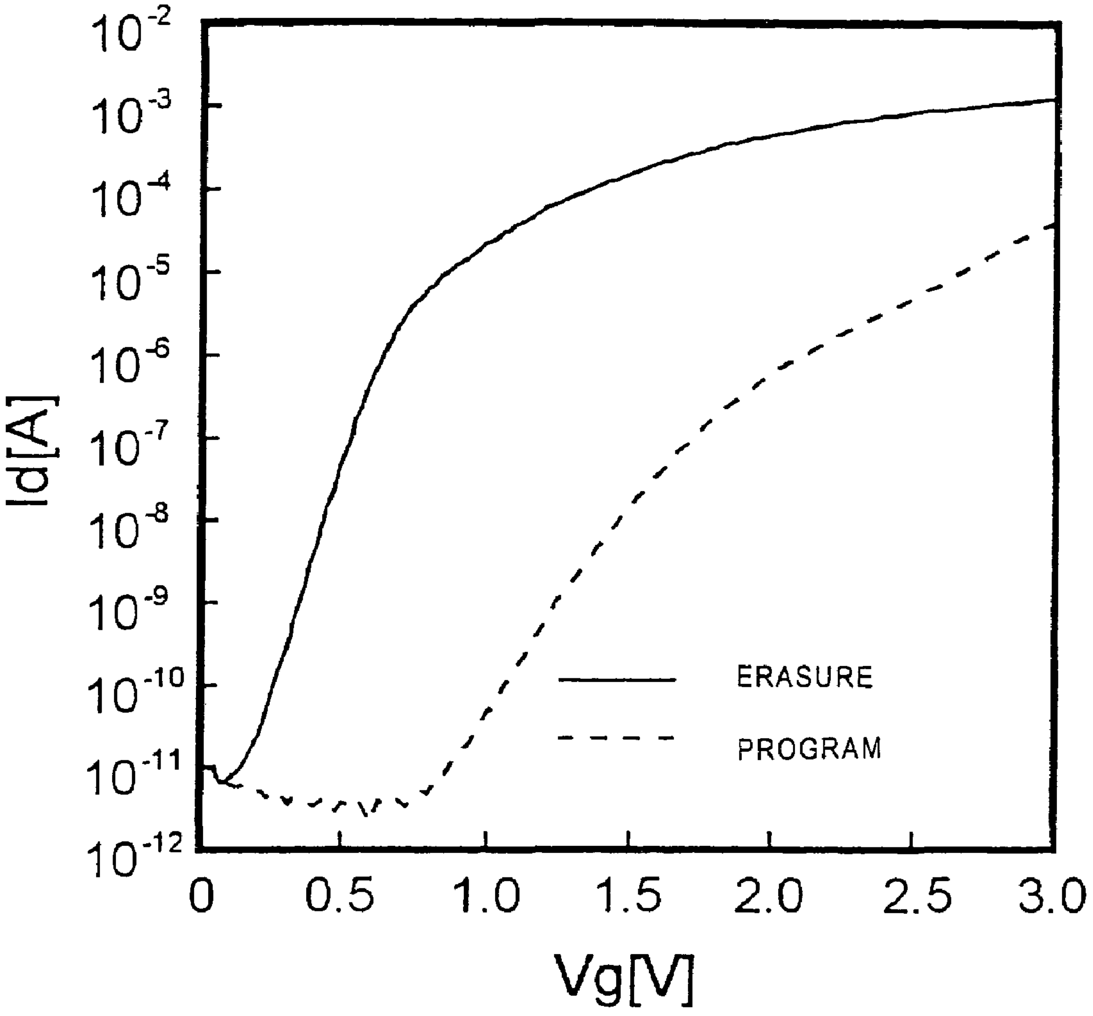
FIG. 21 is a graph showing electric characteristics of the semiconductor memory cell used for the hearing aid according to the present invention.
Figure 22:
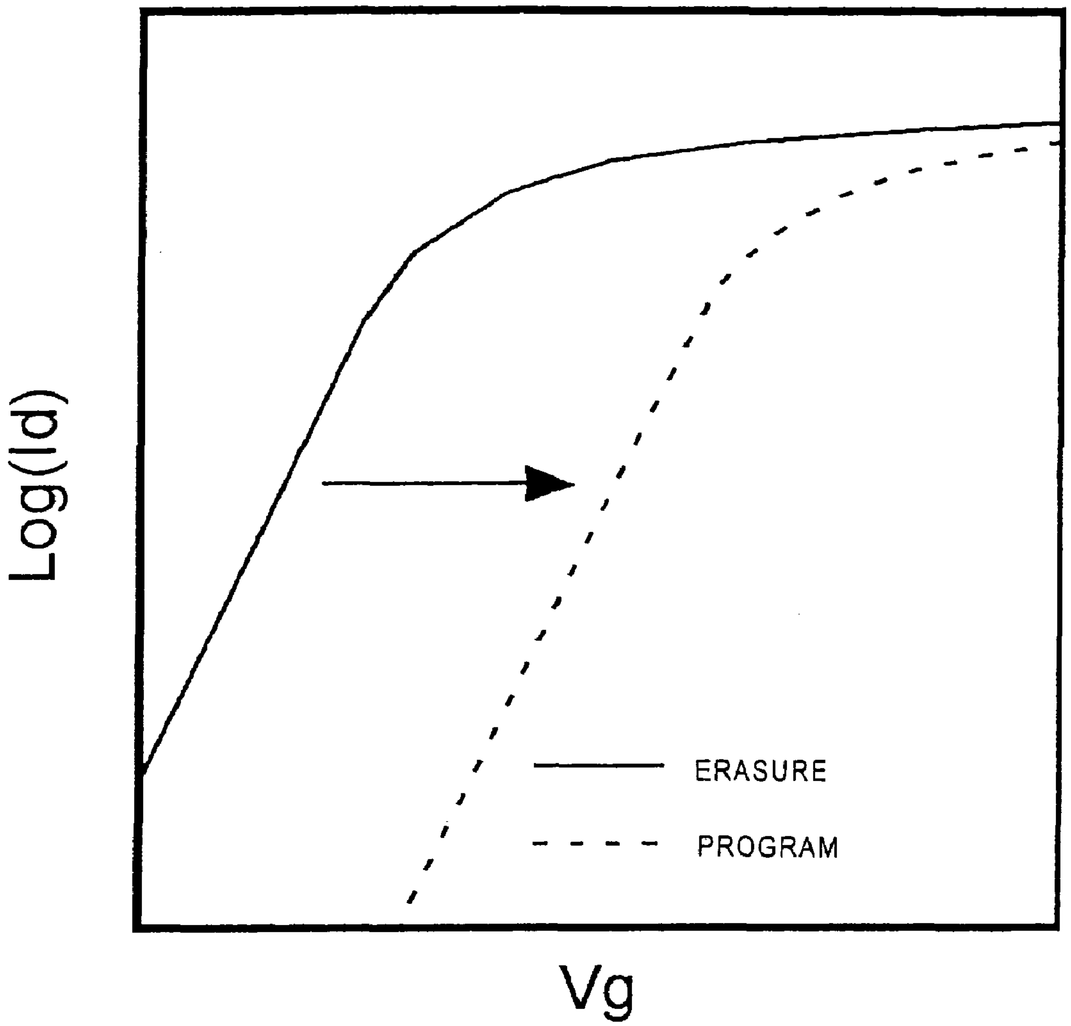
FIG. 22 (PRIOR ART)
FIG. 22 is a graph showing electric characteristics of a conventional EEPROM.
Figure 23:
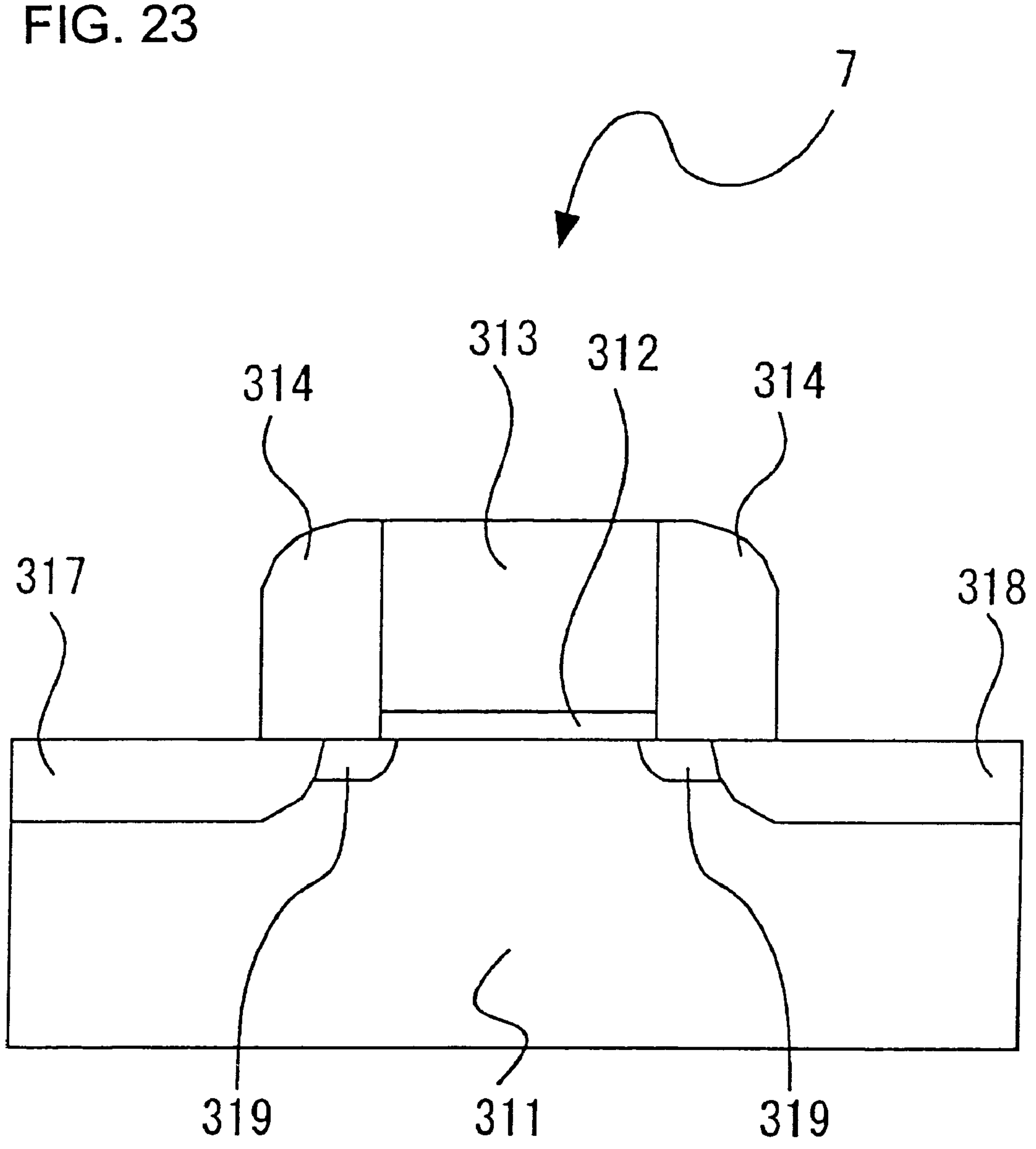
FIG. 23 is a schematic sectional view showing a transistor that constitutes a standard logic unit.

FIG. 21 shows drain current (Id)-to-gate voltage (Vg) characteristics (actual measurement values) when the amount of charges in the memory functional unit in the N channel type semiconductor memory cell. As is obvious from FIG. 21, if the writing operation is performed in the erasing state (a graph indicated by a solid line), not only the threshold simply increases but also the gradient of the graph remarkably decreases in a sub-threshold region. Accordingly, also in a region where the gate voltage (Vg) is relatively high, drain current ratios in the erasing state and the writing state are high. At Vg=2.5V, for example, the current ratio of two digits or more is maintained. The characteristics largely differ from those of the EEPROM (FIG. 22).

Appearance of such characteristics is a peculiar phenomenon which occurs since the gate electrode and the source/drain diffusion regions are offset, respectively, and the gate electric field does not easily reach the offset region. While the semiconductor memory cell is in the writing state, it is extremely difficult to generate the inversion layer in the offset region below each memory functional unit even if the positive voltage is applied to the gate electrode. This is a cause that the gradient of the Id-Vg curve is gentle in the sub-threshold region in the writing state.

On the other hand, while the semiconductor memory cell is in the erasing state, electrons at a high density are induced in the offset regions. Further, when 0 V is applied to the gate electrode (that is, when the gate electrode is in an off state), electrons are not induced in the channel below the gate electrode (consequently, an OFF-state current is low). This is a cause that the gradient of the Id-Vg curve is sharp in the sub-threshold region in the erasing state, and a current increase rate (conductance) is high in the region at the threshold or more.

As is obvious from the above, in the semiconductor memory cell that constitutes the semiconductor memory device of the present invention, the drain current ratios in the writing operation and the erasing operation can be particularly made high.

The embodiments of the hearing aid of the present invention that includes the semiconductor memory cell described in the first to seventh embodiments will be next described.

Tenth Embodiment

A tenth embodiment of the hearing aid of the present invention will be described with reference to FIGS. 2A and 2B.

Figure 2A:
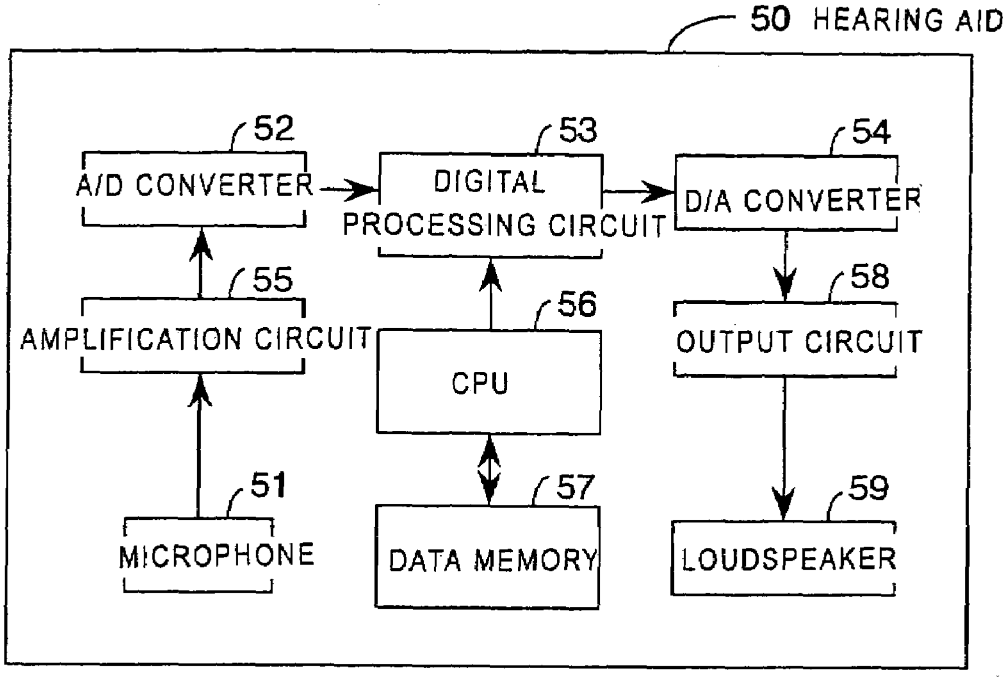
FIG. 2A is a schematic block diagram of the hearing aid according to the present invention.

FIG. 2A is a block diagram which shows the configuration of the hearing aid of the present invention. FIG. 2B shows one example of a circuit diagram of the data memory 57 shown in FIG. 2A when a plurality of semiconductor memory cells are arranged in an array.

Since the hearing aid 50 in the embodiment shown in FIG. 2A is similar in configuration to the conventional hearing aid shown in FIG. 26, it will not be described herein.

The hearing aid 50 in this embodiment differs from the conventional hearing aid in that the semiconductor memory cell (described in the first to seventh embodiments) which can be reduced in size and the manufacturing cost of which can be, therefore, reduced is used in the data memory 57.

If the data memory 57 constructed by the semiconductor memory cell and a logic circuit constructed by the ordinary logic transistor, not shown, are mounted on one chip, a mounting process is quite simple. This is because the semiconductor memory cell of the data memory 57 includes the memory functional units on sidewalls of the gate stack, respectively. Since the mounting process for the semiconductor memory cell and the ordinary logic transistor is quite simple, the effect of reducing the manufacturing cost of the hearing aid of the present invention is further enhanced.

In this embodiment, procedures for mounting the logic circuit constructed by a MOSFET and the data memory 57 constructed by the semiconductor memory cell will be described. Specifically, a photolithography step is added to steps of forming the semiconductor memory cell, thereby separating a region in which so-called lightly-doped drain (hereinafter, "LDD") diffusion regions are formed from a region in which the LDD diffusion regions are not formed. With the configuration, it is possible to manufacture a semiconductor switching cell for the logic circuit or the like and the semiconductor memory cell in parallel on the same substrate. FIGS. 24A to 24C and FIGS. 25D to 25F are diagrams for describing steps of manufacturing these cells.

Figure 24A:
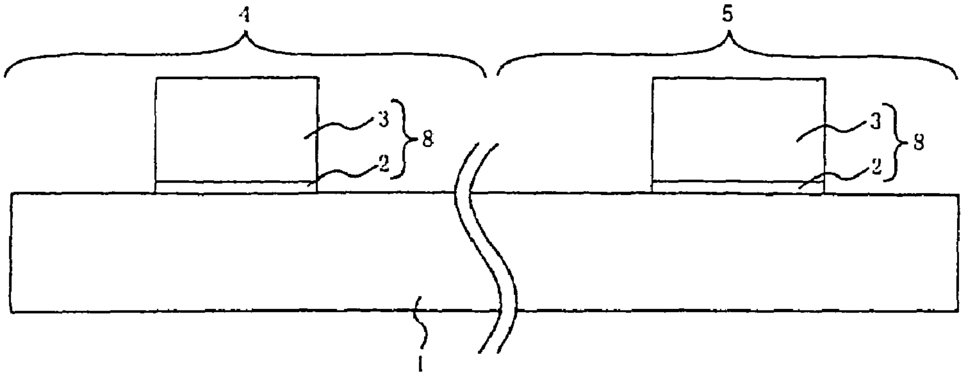
FIGS. 24A to 24C are schematic sectional views each showing a manufacturing step of mounting the semiconductor memory cell according to the present invention together with a semiconductor switching cell to one chip.

As shown in FIG. 24A, the gate insulating film 2 and the gate electrode 3 obtained through a metal oxide semiconductor (hereinafter, "MOS") (metal-oxide film-semiconductor) formation process and having an MOS structure, that is, the gate stack 8 is formed on the semiconductor substrate 1 of the p conductive type.

A typical MOS formation process is as follows.

A device isolation region is formed on the semiconductor substrate 1, which includes a p-type semiconductor region, by a known method. The device isolation region is used to prevent a leakage current from flowing between adjacent devices through the substrate. However, if the adjacent devices are devices that share the source/drain diffusion region, it is unnecessary to form such a device isolation region. Any known device isolation region formation method which uses a known LOCOS oxide film or a known trench isolation region, or any other known method may be used as long as the method can accomplish an object of isolating devices. The device isolation region is not shown.

Next, an insulating film is formed so as to cover a semiconductor region. This insulating film becomes the gate insulating film 2 in the MOSFET. Therefore, it is preferable to form a film excellent in performance as the gate insulating film 2 by executing steps including an $N_2O$ oxidization step, an NO oxidization step, a nitriding step after the oxidization, and the like. The "film excellent in performance as the gate insulating film 2" means the insulating film capable of suppressing any undesirable factor when reduction in size of the MOSFET and the improvement of the performance thereof, for example, suppressing the leakage current that is a current unnecessarily flowing in the gate insulating film 2, and suppressing diffusion of gate electrode impurities into a channel region of the MOSFET while suppressing depletion of the gate electrode impurities. This insulating film is typically an oxide film such as a thermal oxide film, an $N_2O$ oxide film, or an NO oxide film and it is appropriate that a thickness of the film is within a range of 1 to 6 nm.

A gate electrode material is then formed on the insulating film. As the gate electrode material, any one of materials including semiconductors such as polysilicon and doped polysilicon, metals such as Al, Ti and W, and compounds of these metals and silicon can be used as long as the material has a performance as the MOSFET.

A desired photoresist pattern is formed on the gate electrode material by the photolithography step. Using the photoresist pattern as a mask, gate etching is performed to etch the gate electrode material and the gate insulating film 2, thereby forming a structure shown in FIG. 24A. Although not shown in the drawings, the gate insulating film 2 is not necessarily etched. If the gate insulating film 2 is not etched but used as an injection protection film when the impurities are injected in the next step, a step of forming the injection protection film can be simplified.

Alternatively, the gate stack 8 may be formed by the following method. The gate insulating film 2 having the same function as that described above is formed so as to cover the semiconductor substrate 1 which includes the p-type semiconductor region. A gate electrode material having the same function as that described above is formed on the gate insulating film 2. A mask insulating film such as an oxide film, a nitride film or an oxynitride film is formed on the gate electrode material. A photoresist pattern having the same function as that described above is formed on the mask insulating film, and the mask insulating film is etched. The photoresist pattern is then removed, and the gate electrode material is etched using the mask insulating film as an etching mask. The mask insulating film and an exposed portion of the gate insulating film are etched, thereby forming the structure shown in FIG. 24A. Although not shown in the drawings, the gate insulating film 2 is not necessarily etched. If the gate insulating film 2 is not etched but used as an injection protection film when the impurities are injected in the next step, a step of forming the injection protection film can be simplified.

Figure 24B:
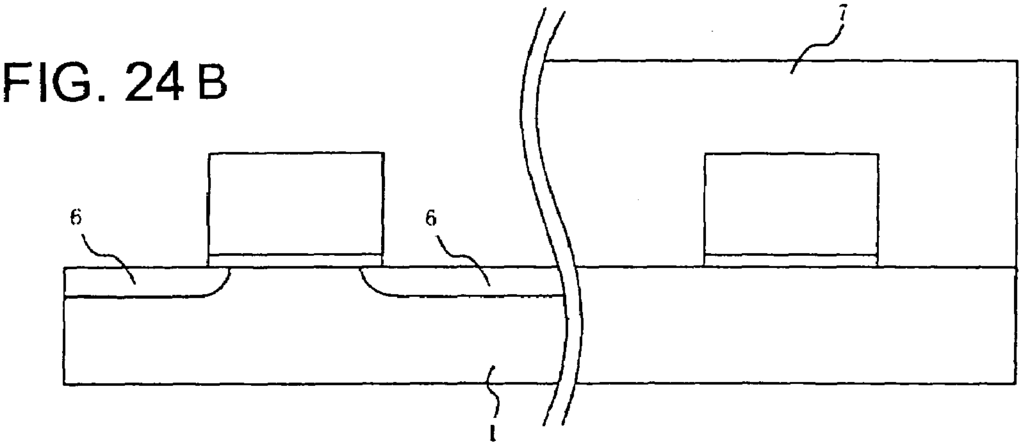

As shown in FIG. 24B, LDD regions 6 are formed only in a logic circuit region 4 shown in FIG. 24A. At this time, a photoresist 7 is formed but the LDD regions 6 are not formed in a memory region 5. While no LDD regions 6 are formed in the memory region 5, the LDD regions 6 can be formed in the logic circuit region 4 for forming the transistor of an ordinary structure. The photoresist 7 is intended to inhibit injection. It suffices that the photoresist 7 is selectively removable and the photoresist 7 may be an insulating film such as a nitride film.

Figure 24C:
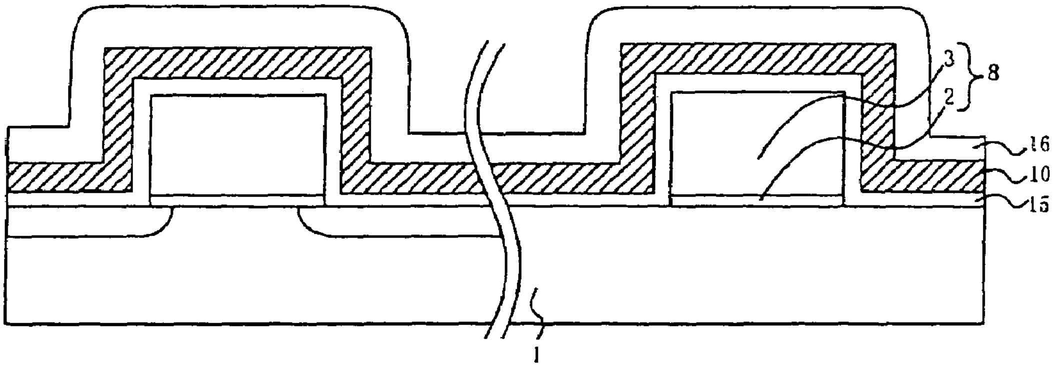

As shown in FIG. 24C, the photoresist 7 is removed, and a first insulating film 15 is formed almost uniformly so as to cover the gate stack 8 and the semiconductor substrate 1. Since this first insulating film 15 becomes the insulating film through which electrons pass, it is preferable to use a film high in withstand voltage, low in leakage current, and high in reliability as the first insulating film 15. For example, similarly to the material for the gate insulating film 2, the oxide film such as the thermal oxide film, the $N_2O$ oxide film or the NO oxide film may be used. If the oxide film is used as the first insulating film 15, a thickness of the film 15 is preferably about 1 to 20 nm. If the first insulating film 15 is formed to be thin enough to cause a tunnel current to flow in the insulating film, a voltage necessary to inject and erase charges can be lowered and low power consumption can be thereby realized. In this case, the thickness of the first insulating film 15 is typically about 1 to 5 nm.

By thus forming the first insulating film 15, a charge retaining part 10 is in contact with the semiconductor substrate 1 and the gate electrode 3 through the insulating film 15. Therefore, this insulating film 15 can suppress leakage of retained charges. Consequently, the semiconductor memory cell having good charge retaining characteristics and high long-term reliability can be formed.

The nitride film 10 is then deposited substantially uniformly. Examples of a material for the nitride film 10 include nitride and oxynitride capable of retaining a matter including charges such as electrons and holes, a material for an oxide film or the like that includes charge traps, ferroelectric capable of inducing charges to a surface of the charge retaining part by such a phenomenon as polarization, and a material having a structure in which a matter capable of retaining charges such as floating polysilicon or silicon dot in an oxide film. Any material can be used as long as it can retain and induce charges. A thickness of the nitride film is preferably about 2 to 100 nm. A second insulating film 16 is then formed almost uniformly. As the second insulating film, a film having a good step coverage and formed by chemical vapor deposition (hereinafter, "CVD") such as a high temperature oxide (hereinafter, "HTO") film may be used. If the HTO film is used as the second insulating film 16, a thickness of the second insulating film 16 may be about 5 to 100 nm.

Figure 25D:
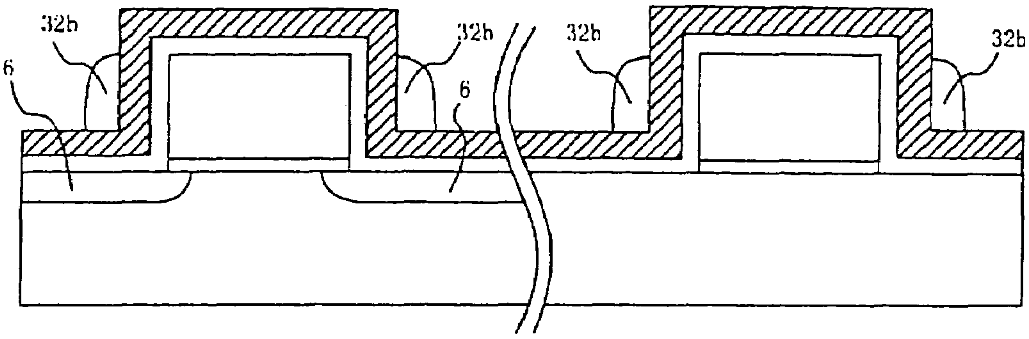
FIGS. 25D to 25F are schematic sectional views each showing a manufacturing step of mounting the semiconductor memory cell according to the present invention together with the semiconductor switching cell to one chip.

As shown in FIG. 25D, the second insulating film 16 is subjected to anisotropic etching, thereby forming the second insulator 32*b* on each sidewall of the gate stack 8 through the first insulating film 15 and the nitride film 10. The etching is preferably performed under conditions that the second insulating film 16 can be selectively etched and an etch selectivity of the second insulator 32 to the nitride film is high.

However, if a material including a matter having electrical conduction such as a conductor or a semiconductor is used as a material for the charge retaining parts, it is necessary to electrically insulate the right and left charge retaining parts 31 from each other after forming the charge retaining parts 31.

Figure 25E:
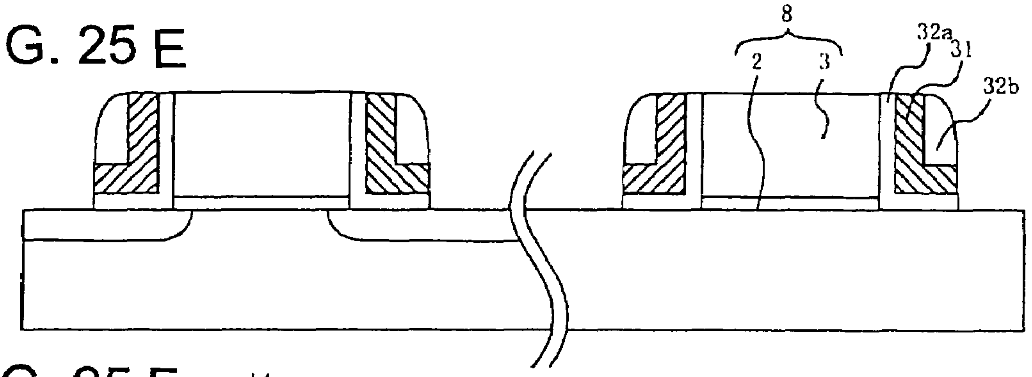

As shown in FIG. 25E, the nitride film 10 is subjected to isotropic etching while using the second insulators 32*b* as an etching mask, thereby forming the charge retaining part 31 on each sidewall of the gate stack 8 through the first insulator 32*a*. In this case, the etching is preferably performed under conditions that the nitride film 10 can be selectively etched and etch selectivities of the nitride film 10 to the first insulating film 15 and the second insulator 32*b* are high.

By anisotropically etching the first insulating film 15, the first insulator 32*a* is formed on each sidewall of the gate stack 8. In this case, the etching is preferably performed under conditions that the first insulator 32*a* can be selectively etched and etch selectivities of the first insulator 32*a* to the second insulator 32*b*, the charge retaining part 31, the gate electrode 3, and to the semiconductor substrate 1 are high.

It is noted, however, that the first insulator 32*a* and the second insulator 32*b* are often made of the oxide films, i.e., made of the same material. In this case, high etch selectivities for the first insulator 32*a* and the second insulator 32*b* cannot be ensured. Therefore, it is necessary to appropriately decrease an etching amount when the second insulator 32*b* is formed in consideration of the etching amount of the second insulator 32*b* when the first insulator 32*a* is etched.

Alternatively, the structure shown in FIG. 24C to the structure shown in FIG. 25E may be formed by executing a single step. Namely, anisotropic etching is performed under conditions that the first insulating film 15, the second insulating film 16, and the nitride film 10 can be all selectively etched and etching selectivities of the first insulating film 15, the second insulating film 16 and the nitride film 10 to the material for the gate electrode 3 and the material for the semiconductor substrate 1 are high, respectively. Therefore, the structures shown in FIGS. 24C to 25E can be formed in one step while three steps are normally necessary. The number of steps can be thereby decreased. In this case, however, if the material including the matter having electric conduction such as the conductor or the semiconductor is used as the material for the charge retaining parts 31, it is necessary to electrically insulate the right and left charge retaining parts 31 from each other.

Figure 25F:
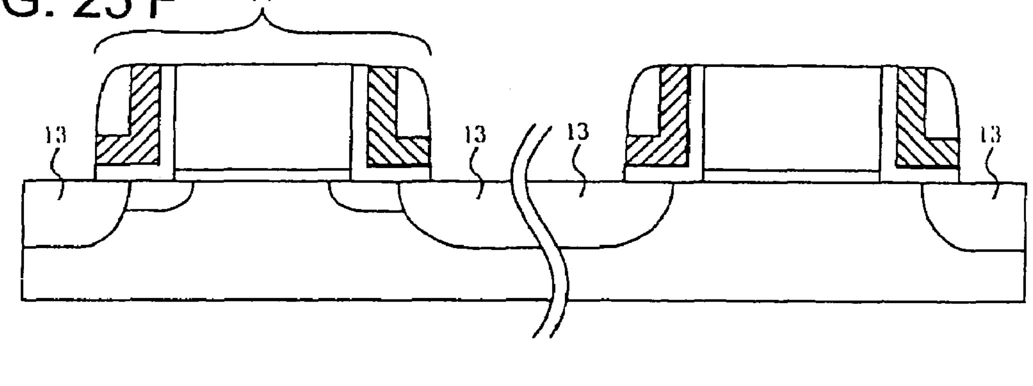

As shown in FIG. 25F, using a source/drain injection mask region 14 including the gate electrode 3, the first insulators 32*a*, the second insulators 32*b* and the charge retaining parts 32 as a mask, carries are injected for the formation of source and drain regions. Further, a predetermined heat treatment is performed. The source/drain diffusion regions 13 can be thereby formed.

By using the above-described process, the semiconductor switching cell which is user for the logic circuit or the like in which the LDD regions are formed, and the semiconductor memory cell used in the memory region can be automatically, easily formed on the same substrate through the same steps without the need of particularly complicated steps but only by adding the simple step.

In addition, if the charges are retained in the charge retaining parts, part of the channel region is greatly influenced by the charges and the drain current, therefore, changes. Consequently, the semiconductor memory cell which discriminates whether charges are present based on the change of the drain current is formed.

Further, by disposing the gate insulating film 2 and each charge retaining part 31 to be separated from each other, the semiconductor memory cell having the effect of suppression of the short channel effect equal to or greater than that of the semiconductor switching cell can be formed simultaneously with the semiconductor switching cell through the same manufacturing steps. Therefore, the mounting process for the loci circuits such as peripherals of the memory and the memory cell array can be carried out quite easily.

According to this semiconductor memory cell, the short channel effect can be considerably suppressed while realizing storage of two bits per one transistor, and reduction in size can be realized. In addition, the high-speed operation and the low power consumption can be realized.

Each charge retaining part is in contact with the semiconductor substrate and the gate electrode through the insulating film. Therefore, this insulating film can suppress the leak of the retained charges. Consequently, the semiconductor memory cell having good charge retaining characteristics and high long-term reliability can be formed.

Moreover, each charge retaining part is of the L-shaped structure. As compared with the charge retaining part in the second embodiment, this charge retaining part can be further reduced in size. Thus, the charge retaining part can be formed in the vicinity of the channel, so that the electrons injected in the writing operation can be easily removed. Erase error can be thereby prevented. Besides, by the reduction in size of the charge retaining part, the charges can be efficiently erased, so that the semiconductor memory cell having high reliability and fast reading and erasing speeds can be formed.

If the conductor or the semiconductor is used as the material for the charge retaining part and the positive potential is applied to the gate electrode, then polarization occurs in the charge retaining part, electrons are induced to neighborhoods of the sidewalls of the gate electrodes, and electrons in the vicinity of the channel region decrease. It is thereby possible to accelerate injection of electrons from the substrate or the source/drain diffusion region, and to thus form the semiconductor memory cell having the high writing speed and high reliability.

As can be understood from the steps described above, procedures for forming the semiconductor memory cell have a high similarity to those for the semiconductor switching element formation process. Namely, the configuration of the semiconductor memory cell is comparable to the well-known, ordinary semiconductor switching cell. To change the ordinary semiconductor switching cell to the semiconductor memory cell described above, it suffices, for example, that a material having the function as the memory functional unit is used for the sidewall spacer of the well-known, ordinary semiconductor switching cell and that the LDD regions are not formed. Even if the sidewall spacer of the semiconductor switching cell that constitutes the logic circuit or the like functions as the memory functional unit, there is no possibility of deteriorating the transistor performance as long as the width of the sidewall spacer is appropriate and the cell operates within a voltage range in which no rewriting operation occurs. Accordingly, the semiconductor switching cell and the semiconductor memory cell can use the common sidewall spacer.

To mount the semiconductor switching cell that constitutes the logic circuit or the like and the semiconductor memory cell, it is further necessary to form the LDD structure only in the logic circuit or the like. To form the LDD structure, impurities may be injected for the formation of the LDD regions after forming the gate electrode and before depositing the material for the memory functional units. Therefore, by masking only the data memory region 5 with the photoresist 7, it is possible to easily mount the semiconductor memory cell and the semiconductor switching cell that constitutes the logic circuit or the like. Furthermore, if an SRAM is constructed by the semiconductor memory cell and the semiconductor switching cell that constitutes the logic circuit or the like, it is possible to easily mount the memory, the logic circuits, and the SRAM on the same chip.

If it is necessary to apply a higher voltage than an allowable voltage for the logic circuit, the SRAM unit, and the like to the semiconductor memory cell, it suffices to use a high withstand voltage well formation mask and a high withstand voltage gate insulating film formation mask in addition to a standard semiconductor switching cell formation mask. Conventionally, for the mounting process for mounting the EEPROM and the logic circuit on one chip, the number of masks necessary for the process and manpower therefor considerably increase, which greatly differs from the standard semiconductor switching cell process. Therefore, the mounting process in this embodiment can greatly decrease the number of masks and the manpower for the process, as compared with the conventional mounting process for mounting the EEPROM and circuits for the logic circuit or the like on one chip. Consequently, chip yield for chips on each of which the semiconductor switching cell that constitutes the logic circuit or the like and the semiconductor memory cell are mounted can be enhanced, and cost reduction can be realized.

This semiconductor memory cell can realize storage of two bits per transistor. The principle of writing, erasing, and reading methods will be described below. A case in which the semiconductor memory cell is of the N channel type will be described herein. If the semiconductor memory cell is of the P channel type, the principle for the N channel type may be adapted by inverting voltage signs. As for nodes (a source, a gate and a substrate) to which voltages applied are not particularly designated, a ground voltage may be applied thereto.

If information is written to the semiconductor memory cell, a positive voltage is applied to the gate and a positive voltage equal to or higher than the gate voltage is applied to the drain. At this time, charges (electrons) supplied from the source are accelerated near an end of the drain, changed to hot electrons, and injected into the drain-side memory functional unit. At that time, no electrons are injected into the source-side memory functional unit. Thus, information can be written to the memory functional unit on the specific side. By interchanging the source and the drain, two bits can be easily written to the semiconductor memory cell.

To erase the information written to the semiconductor memory cell, hot hole injection is utilized. A positive voltage may be applied to a diffusion layer region (source/drain) on the side on which the memory functional unit from which the information is to be erased is present, and a negative voltage may be applied to the gate. At this time, in the semiconductor substrate and a PN junction in the diffusion layer region applied with the positive voltage, positive holes are generated by interband tunneling. The positive holes are attracted by the gate having the negative potential, and injected into the memory functional unit from which the information is to be erased. Thus, the information on the specific side can be erased. To erase the information written to the memory functional unit on the opposite side, a positive voltage may be applied to the memory functional unit on the-opposite side.

Next, to read the information written to the semiconductor memory cell, the source/drain diffusion region on the side on which the memory functional unit from which the information is to be read is present is set as the source, and the source/drain diffusion region on the opposite side is set as the drain. Namely, a positive voltage may be applied to the gate and a positive voltage equal to or higher than the gate voltage may be applied to the drain (which is set as the source in the writing operation). At this time, however, the voltages should be set sufficiently low so that information is not written to the semiconductor memory cell. A drain current changes according to the amount of charges accumulated in the memory functional unit. To read the information written to the memory functional unit on the opposite side, the source and the drain may be interchanged.

The methods of erasing and reading the written information described above are one example in which the nitride film is used for the memory functional units, and the other methods can be used. Further, even if a material other than the silicon nitride is used for the memory functional units, the above-described methods or wiring and erasing methods other than the methods can be used.

Further, the memory functional units are disposed not below the gate electrode but on the both sides of the gate electrode, respectively. Therefore, it is unnecessary to cause the gate insulating film to function as the memory functional units. The gate insulating film can be separated from the memory functional units, used to function only as the gate insulating film, and designed according to LSI scaling rules. Due to this, differently from the flash memory, it is unnecessary to insert the floating gate between the channel and the control gate and to adopt the ONO film having the memory function as the gate insulating film, it is possible to adopt the gate insulating film according to reduction in size, the influence of the electric field of the gate electrode on the channel increases, and the semiconductor memory cell having the memory function strong against the short channel effect can be realized. Consequently, the semiconductor memory cell which can be reduced in size to thereby improve integration, and which can be manufactured at a low cost can be provided.

According to this semiconductor memory cell, the memory functional units are formed independently of the gate insulating film, and formed on the both sides of the gate electrode, respectively. Therefore, the semiconductor memory cell can perform the two-bit operation. Since each memory functional unit is isolated from each other by the gate electrode, it is possible to effectively suppress the memory functional units from interfering with each other at the time of rewriting. Further, since the memory function of each memory functional unit is separated from the transistor operation function of the gate insulating film, the gate insulating film can be formed to be thin and the short channel effect can be suppressed. This can, therefore, facilitate the reduction in the size of the semiconductor memory cell.

Figure 2B:
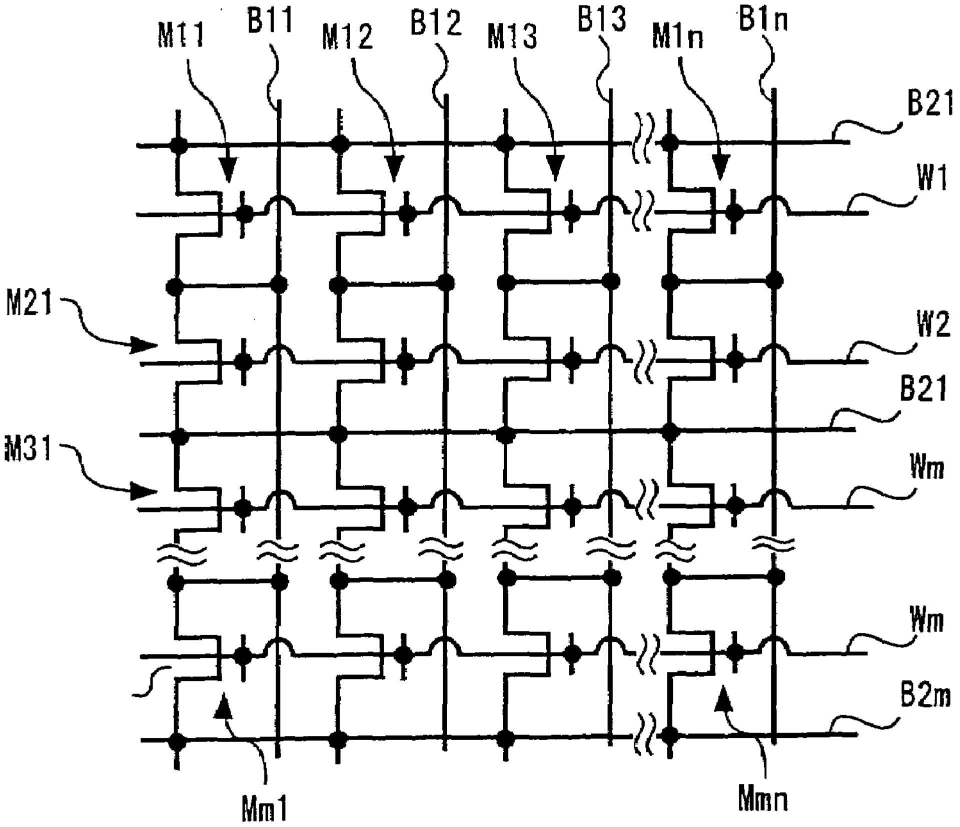
FIG. 2B is a circuit diagram showing one embodiment of arranging the semiconductor memory cells used for the hearing aid in a cell array.

FIG. 2B is a circuit diagram which shows one example of a memory array constituted by arranging the semiconductor memory cells. In FIG. 2B, reference character Wm denotes an m-th word line (therefore, W1 denotes a first word line), B1$_n$ denotes an n-th first bit line, B2*m* denotes an m-th second bit line, and Mmn denotes a memory cell connected to the m-th word line (m-th second bit line) and to the n-th first bit line. The arrangement of the memory cell array is not limited to this example but may be such that first bit lines and second bit lines are arranged in parallel or such that all of the second bit lines are connected to one another to serve as a common source line.

The semiconductor memory cell can be easily reduced in size and perform the two-bit operation. Therefore, an area of the memory cell array constituted by arranging the semiconductor memory cells can be easily reduced, as well. Accordingly, it is possible to reduce a cost of the memory cell array. If this memory cell array is employed for the data memory 57 of the hearing aid, the cost of the hearing aid is reduced.

The memory functional unit in the semiconductor memory cell used for the hearing aid of the present invention preferably has the sandwich structure in which the film made of the first insulator that accumulates charges is sandwiched between the film made of the second insulator and the film made of the third insulator similarly to the semiconductor memory cell shown in, for example, FIG. 5. More preferably herein, the first insulator is a silicon nitride and the second and third insulators are silicon oxides. The semiconductor memory cell including such memory functional units can ensure high-speed rewriting and high reliability, and exhibit sufficient retaining characteristics. Therefore, if such a semiconductor memory cell is employed for the hearing aid of the present invention, it is possible to improve the reliability of the hearing aid because of the good retaining characteristics of the semiconductor memory cell. Besides, the semiconductor memory cell is compatible with the ordinary silicon process. The hearing aid can be, therefore, provided at a low cost.

Moreover, the semiconductor memory cell used for the hearing aid of the present invention is preferably the semiconductor memory cell in the sixth embodiment. Namely, it is preferable that the thickness (T1) of the insulating film that isolates the charge retaining film (silicon nitride film 142) from the channel formation region or well region is smaller than the thickness of the gate insulating film and is 0.8 nm or more. In such a semiconductor memory cell, the writing operation and the erasing operation are performed at low voltages or the writing operation and the erasing operation are performed at high speeds. Further, the memory effect of the semiconductor memory cell is great. Accordingly, if such a semiconductor memory cell is used for the hearing aid of the present invention, it is possible to reduce a power supply voltage of the hearing aid or to accelerate the operating speed of the hearing aid.

Alternatively, the semiconductor memory cell used for the hearing aid of the present invention is preferably the semiconductor memory cell in the seventh embodiment. Namely, it is preferable that the thickness (T1) of the insulating film that isolates the charge retaining film (silicon nitride film 142) from the channel formation region or well region is larger than the thickness (T2) of the gate insulating film and is 20 nm or less. Such a semiconductor memory cell can improve the retaining characteristics without deteriorating the short channel effect thereof. Therefore, even if the semiconductor memory cells are highly integrated, sufficient storage retaining characteristics can be obtained. Consequently, if such a semiconductor memory cell is used for the hearing aid of the present invention, it is possible to increase the storage capacity of the data memory 57 to enhance the function of the data memory 57, and to reduce the manufacturing cost of the hearing aid.

Further, in the semiconductor memory cell used for the hearing aid of the present invention, it is preferable that the regions (silicon nitride films 142) that retain charges in the memory functional units 161 and 162 are overlapped with the source/drain diffusion regions 112 and 113, respectively, as described in the first embodiment. With such a semiconductor memory cell, the reading speed can be sufficiently accelerated. As compared with the semiconductor memory cell in which the regions (silicon nitride films 142) that retain charges in the memory functional units 161 and 162 are not overlapped with the source/drain diffusion regions 112 and 113, respectively, the drive current can be greatly increased. Accordingly, if the same drive current is to be secured for the both semiconductor memory cells, the semiconductor memory cell in which the regions (silicon nitride films 142) that retain charges in the memory functional units 161 and 162 are overlapped with the source/drain diffusion regions 112 and 113, respectively can contribute to lower power consumption. Consequently, if such a semiconductor memory cell is used for the hearing aid of the present invention, the low power consumption of the hearing aid can be realized.

Moreover, in the semiconductor memory cell used for the hearing aid of the present invention, it is preferable that the memory functional unit includes the charge retaining film arranged almost in parallel with the surface of the gate insulating film as described in the first embodiment. With such a semiconductor memory cell, variations in the memory effect thereof can be reduced, and variations in reading current can be, therefore, suppressed. Besides, since the change in the characteristics of the semiconductor memory cell which has been storing and retaining the information can be reduced, the storage retaining characteristics of the semiconductor memory cell can be improved. Consequently, if such a semiconductor memory cell is used for the hearing aid of the present invention, the reliability of the hearing aid can be improved.

In the semiconductor memory cell used for the hearing aid of the present invention, it is preferable that the memory functional unit includes the charge retaining film arranged almost in parallel with the surface of the gate insulating film and includes the portion extending almost in parallel with the side surface of the gate electrode as described in the second embodiment. With such a semiconductor memory cell, the rewriting operation is performed at a high speed. Consequently, if such a semiconductor memory cell is used for the hearing aid of the present invention, the rewriting time of the hearing aid can be shortened.

Eleventh Embodiment

The hearing aid in the eleventh embodiment will be described with reference to FIGS. 3 and 4.

Figure 3:
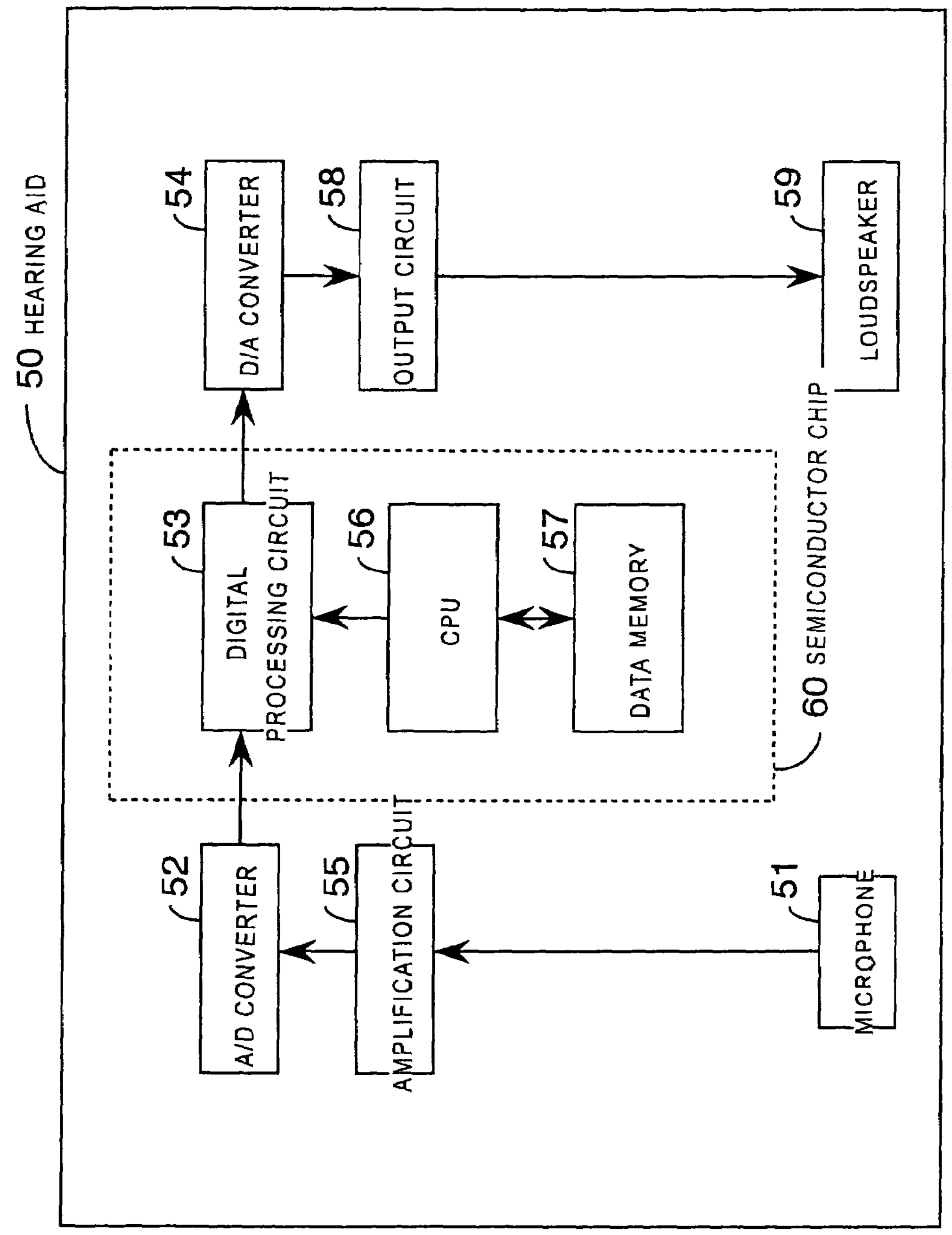
FIG. 3 is a block diagram showing the configuration of one embodiment of the hearing aid according to the present invention.
Figure 4:
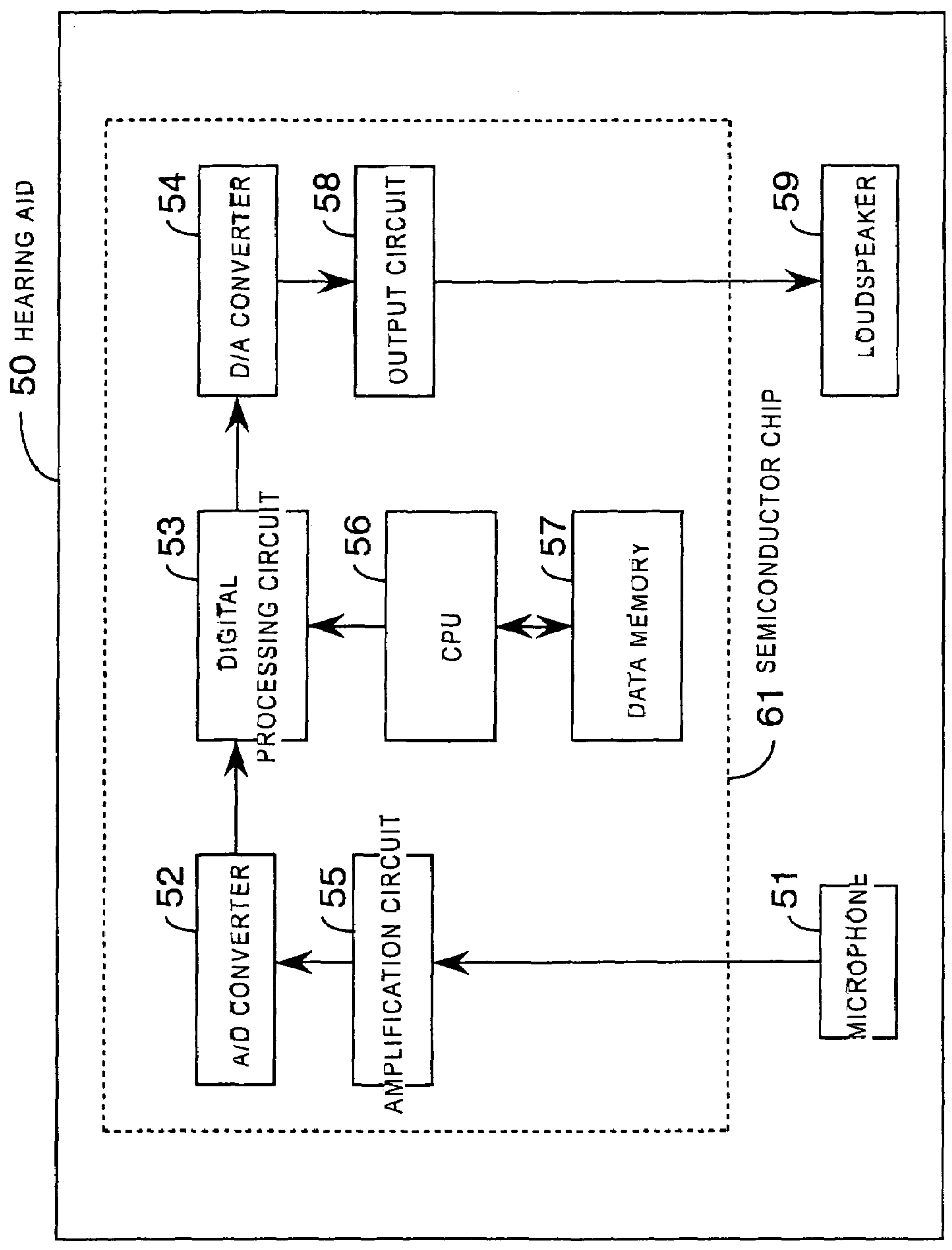
FIG. 4 is a block diagram showing the configuration of another embodiment of the hearing aid according to the present invention.

FIGS. 3 and 4 illustrate that part of the configuration of the hearing aid shown in FIG. 2A is formed on one semiconductor chip.

The configuration of the hearing aid shown in FIG. 3 differs from that of the hearing aid shown in FIG. 2A in that the data memory 57, the CPU 56, and the digital processing circuit 53 are formed on one semiconductor chip 60, i.e., the data memory 57, together with the CPU 56 and the digital processing circuit 53, is mounted on the chip 60.

The configuration of the hearing aid shown in FIG. 4 differs from that of the hearing aid shown in FIG. 3 in that each of the amplification circuit 55, the A/D converter 52, the D/A converter 54, and the output circuit 58 is made of the logic circuit or the like using the ordinary semiconductor switching cell (note, "the logic circuit or the like" means the device that employs the semiconductor switching cell), and that the amplification circuit 55, the A/D converter 52, the D/A converter 54, and the output circuit 58 are mounted on one semiconductor chip 61.

These configurations exhibit the mounting process effect as already described in the tenth embodiment. For example, the semiconductor memory cell that constitutes the data memory 57 has a high similarity in formation process to the cell that constitutes each of the CPU and the logic circuit in the digital processing circuit. Therefore, both the semiconductor memory cell and the latter cell can be easily mounted on one chip. If the data memory is included in each of the CPU and the logic circuit in the digital processing circuit and they are formed on one chip, the cost of the hearing aid can be considerably reduced. Besides, since the semiconductor memory cell is used in the data memory, the mounting process can be greatly simplified as compared with, for example, the case of using the EEPROM.

Consequently, the effect of cost reduction attained by forming the CPU, the logic circuit in the digital processing circuit, and the data memory on one chip is particularly great. Further, by decreasing a wiring delay, the operation speed can be accelerated. The logic circuit mounted together with the semiconductor memory cell may be appropriately selected. It does not necessarily mean that the CPU, the digital processing circuit, and up to the data memory should be mounted on one chip. By mounting the CPU and the data memory on one chip, the effect attained by mounting the semiconductor switching cell and the semiconductor memory cell of the present invention on one chip can be exhibited. Therefore, the effect of reduction in size and reduction in cost of the hearing aid can be also exhibited.

As shown in FIG. 4, by mounting many circuits on one chip, further reduction in size, further reduction in cost, and further acceleration in speed due to the decrease of the wiring delay can be obtained.

Twelfth Embodiment

In the twelfth embodiment, a method of controlling the hearing aid of the present invention will be described.

According to the conventional hearing aid, the data memory is expensive and it is difficult to secure a sufficient storage capacity for the data memory of a size by which the data memory is contained in the hearing aid. Further, since the storage capacity of a program that controls the hearing aid cannot be secured sufficiently, the program cannot be rewritten.

According to the hearing aid in this embodiment, by contrast, the semiconductor memory cell described above is adopted for the data memory 57. It is thereby possible to store a set of parameters for determining a program that prescribes the operation of the logic circuit described in the eleventh embodiment and hearing aid characteristics. In addition, the CPU 56 functions as a control unit based on the program and controls the hearing aid using the stored parameters. The program and parameters are characterized by being rewritable from the outside.

An analog signal input from the microphone 51 shown in FIG. 3 is passed through the amplification circuit 55 and the A/D converter 52, converted to a digital signal, and digitally processed by the digital processing circuit 57 so as to obtain the hearing aid characteristics suited to the user of the hearing aid. In this digital processing, an output level relative to an input level is converted in each frequency band using the parameters according to the hearing aid characteristics that are stored in the data memory 57, and a sound from which a noise is reduced is produced. This sound is output from the loudspeaker 58 through the D/A converter 54 and the like. The CPU 56 controls the operation of the digital processing circuit 53 based on the program. The parameters for determining the hearing aid characteristics include a parameter for determining an amplification factor in each input frequency band, that for determining an amplification factor in each input sound pressure band (which means a magnitude of the sound), that for specifying a noise level, and the like. It is noted, however, that the parameters are not limited to those described above but known parameters and parameters which may be able to be used as a result of future study and development other than those parameters may be used.

In this embodiment, the data memory 57 is constructed by the semiconductor memory cell described in the preceding embodiments. Therefore, the following effects can be exhibited. First, since each memory functional unit is, differently from the conventional EEPROM, isolated from the transistor operation function of the gate insulating film, it is possible to make the gate insulating film thin and to suppress the short channel effect. Accordingly, it is possible to realize reduction in the size of the semiconductor memory cell, to increase the capacity of the semiconductor memory cell, and to reduce a unit cost per bit. Further, the cost of the data memory 57 constructed by a plurality of semiconductor memory cells can be reduced, and the cost of the hearing aid that includes the data memory 57 can be reduced. Besides, the process of forming the semiconductor memory cell is quite similar to the process of forming the cell that constitutes the logic circuit. Therefore, it is easy to mount the semiconductor memory cell and the logic circuit on one chip, thereby making it possible to minimize cost increase.

The parameters used for the program are rewritable from the outside. Due to this, by rewriting the parameters at need, signal amplification according to, for example, each user's characteristics can be made and the function of the hearing aid can be rapidly improved. The programs are rewritable, as well. Due to this, if a new program having an improved function is created, the previous program is rewritten to the new program without purchasing a new hearing aid, whereby the user can continuously use the same hearing aid.

Alternatively, a plurality of sets of parameters for determining the hearing aid characteristics that can prescribe the operation of the logic circuit may be stored in the data memory 57. If so, one set of parameters used for the program may be selected from the plurality of sets of parameters by extracting features (e.g., a maximum sound pressure, a frequency band of the maximum sound pressure, and a sound pressure in a specific frequency band) of the input signal input through the microphone 51.

By appropriately selecting one set of parameters used for the program based on the input signal, the noise can be reduced and a conversation sound and an alarm sound are amplified in, for example, a noisy environment, or if a specific conversation sound is input, the sound can be amplified. Thus, it is possible to use the parameters for different hearing aid characteristics according to the environment, and to further rapidly improve the function of the hearing aid.

First, according to the hearing aid of the present invention, in the semiconductor memory cell that constitutes the data memory, the memory functional units are formed independently of the gate insulating film and formed on the both sides of the gate electrode, respectively. Therefore, each memory functional unit is separated from the gate electrode. It is thereby possible to effectively suppress interference during rewriting. In addition, the memory function of each memory functional unit is separated from a transistor operation function of the gate insulating film. Therefore, it is possible to make the gate insulating film to be thin, and to suppress the short channel effect. Accordingly, the semiconductor memory cell can be easily reduced in size.

The semiconductor memory cell can be easily reduced in size, and the area of the data memory that is constructed by a plurality of the semiconductor memory cells can be reduced. It is, therefore, possible to reduce the cost of the data memory. Accordingly, reduction in size and reduction in cost of the hearing aid that includes the data memory can be realized.

Second, according to the hearing aid of the present invention, the data memory includes a plurality of semiconductor memory cells, which exhibits actions and effects of the cost reduction and the like. Further, since the hearing aid includes the logic circuit, not only a simple storage function but various other functions can be provided to the hearing aid.

According to the present invention, since the data memory and the logic circuit are formed on one chip, the number of chips included in the hearing aid decreases and the cost of the hearing aid is thereby reduced. Further, since the process of forming the semiconductor memory cell that constitutes the data memory is quite similar to the process of forming the cell that constitutes the logic circuit, the mounting process for mounting the both cells on one chip is particularly easily carried out.

According to the present invention, the data memory is rewritable from the outside. Therefore, by rewriting the program as needed, the functions of the hearing aid can be considerably improved. Further, the semiconductor memory cell can be easily reduced in size. Due to this, even if the semiconductor memory cell replaces, for example, a mask ROM, it is possible to minimize an increase in a chip area.

Furthermore, one semiconductor memory cell of the present invention can store two bits of information. Therefore, a cell area per bit is reduced in half and the area of the data memory can be further reduced. The cost of the hearing aid can be further reduced, accordingly.

Moreover, if each of the memory functional units is made of the first insulator, the second insulator, and the third insulator, the first insulator has the function of accumulating the charges, and has the structure in which the first insulator is sandwiched between the second insulator and the third insulator, the first insulator is made of silicon nitride, and each of the second and third insulators is made of silicon oxide, then the leak of the charges is suppressed. It is, therefore, possible to improve the reliability of the hearing aid and to reduce the cost of the hearing aid.

If the thickness of the film made of the second insulator on the channel formation region is smaller than a thickness of the gate insulating film and 0.8 nm or more, then the power supply voltage of the hearing aid can be lowered, and the operation speed of the hearing aid can be accelerated.

If the thickness of a film made of the second insulator on the channel formation region is larger than a thickness of the gate insulating film and 20 nm or less, then it is possible to increase the storage capacity of the data memory in the hearing aid to thereby improve the function of the data memory, and to reduce the manufacturing cost of the hearing aid.

Since the film made of the first insulator includes the portion having the surface almost in parallel with the surface of the gate insulating film, the reliability of the hearing aid can be improved.

In addition, since the film made of the first insulator includes the portion extending almost in parallel with the side surface of the gate electrode, time for rewriting the parameters of the hearing aid can be shortened.

Since part of or all of each of the memory functional units is formed to be overlapped with part of the first diffusion regions, reduction in power consumption of the hearing aid can be realized.

What is claimed is:

1. A hearing aid comprising a data memory that includes a plurality of semiconductor memory cells, wherein each semiconductor memory cell includes:

a gate insulating film formed on a semiconductor substrate, on a well region provided in the semiconductor substrate or on a semiconductor film deposited on an insulator;

a single gate electrode formed on the gate insulating film;

two memory functional units formed on both sidewalls of the single gate electrode;

a channel formation region formed under the single gate electrode; and first diffusion regions disposed on both sides of the channel formation region, and the semiconductor memory cell is constituted so as to change an amount of currents flowing from one of the first diffusion regions to the other first diffusion region according to an amount of charges retained in the memory functional unit or a polarization vector when a voltage is applied to the gate electrode, wherein each memory functional unit is made of a first insulator, a second insulator and a third insulator, the first insulator has a function of accumulating charges and, also, has a structure in which the first insulator is sandwiched between the second insulator and the third insulator, the first insulator is made of silicon nitride, and each of the second and third insulators is made of silicon oxide.

2. A hearing aid comprising a semiconductor device in which a data memory and a logic circuit are disposed on one semiconductor substrate, wherein the data memory is constructed by a semiconductor memory cell, the logic circuit is constructed by a semiconductor switching cell, each of the semiconductor memory cell and the semiconductor switching cell includes:

a gate electrode formed on the semiconductor substrate via a gate insulating film;

a channel formation region formed under the gate electrode;

a pair of first diffusion regions disposed on both sides of the channel formation region and having a conductive type opposite to that of the channel formation region; and memory functional units disposed on sidewalls of the gate electrode and including a charge retaining part having the function of retaining charges and a dissipation preventing insulator having the function of suppressing dissipation of the charges, and the semiconductor memory cell is constituted so as to change an amount of currents flowing from one of the first diffusion regions to the other first diffusion region according to an amount of charges retained in the memory functional unit when a voltage is applied to the gate electrode, wherein the memory functional units are made of a first insulator, a second insulator and a third insulator, the first insulator has a function of accumulating charges and, also, has a structure in which the first insulator is sandwiched between the second insulator and the third insulator, the first insulator is made of silicon nitride, and each of the second and third insulators is made of silicon oxide.

3. The hearing aid according to claim 1 or 2, wherein the data memory includes a controller that stores a plurality of sets of parameters for determining hearing aid characteristics, that analyzes an input signal inputted to a logic circuit, and that selects one of the sets of parameters used to determine the hearing aid characteristics.

4. The hearing aid according to claim 1, wherein two bits of information are stored in each semiconductor memory cell.

5. The hearing aid according to claim 1 or 2, wherein a film made of the second insulator on the channel formation region is thinner than the gate insulating film and is 0.8 nm or more.

6. The hearing aid according to claim 1 or 2, wherein a film made of the second insulator on the channel formation region is thicker than the gate insulating film and is 20 nm or less.

7. The hearing aid according to claim 1 or 2, wherein a film made of the first insulator includes a portion having a surface almost in parallel to a surface of the gate insulating film.

8. The hearing aid according to claim 7, wherein the film made of the first insulator includes a portion extending almost in parallel to a side surface of the gate electrode.

9. The hearing aid according to claim 1 or 2, wherein a part of or all of each memory functional unit is formed to be overlapped with a part of the first diffusion region.

10. The hearing aid according to claim 2, wherein two bits of information are stored in the semiconductor memory cell.

* * * * *